(12) United States Patent
Lu et al.

(10) Patent No.: US 11,345,778 B2
(45) Date of Patent: May 31, 2022

(54) ORGANIC DIELECTRIC MATERIALS AND DEVICES INCLUDING THEM

(71) Applicant: Flexterra, Inc., Skokie, IL (US)

(72) Inventors: Shaofeng Lu, Skokie, IL (US); Antonio Facchetti, Skokie, IL (US); Mark Seger, Skokie, IL (US); Zhihua Chen, Skokie, IL (US); Yu Xia, Skokie, IL (US); Timothy Chiu, Skokie, IL (US); Joshua Lee Ayers, Skokie, IL (US)

(73) Assignee: Flexterra, Inc., Skokie, IL (US)

( * ) Notice: Subject to any disclaimer, the term of this patent is extended or adjusted under 35 U.S.C. 154(b) by 0 days.

(21) Appl. No.: 16/962,760

(22) PCT Filed: Jan. 21, 2019

(86) PCT No.: PCT/US2019/014429
§ 371 (c)(1),
(2) Date: Jul. 16, 2020

(87) PCT Pub. No.: WO2019/144082
PCT Pub. Date: Jul. 25, 2019

(65) Prior Publication Data
US 2020/0354510 A1  Nov. 12, 2020

Related U.S. Application Data

(60) Provisional application No. 62/619,225, filed on Jan. 19, 2018.

(51) Int. Cl.
*C08G 61/08* (2006.01)
*H01L 51/05* (2006.01)

(52) U.S. Cl.
CPC ............ *C08G 61/08* (2013.01); *H01L 51/052* (2013.01); *C08G 2261/135* (2013.01);
(Continued)

(58) Field of Classification Search
USPC ..................................................... 525/332.1
See application file for complete search history.

(56) References Cited

U.S. PATENT DOCUMENTS

| 5,468,819 A | 11/1995 | Goodall |
| 5,905,129 A | 5/1999 | Murakami |

(Continued)

FOREIGN PATENT DOCUMENTS

| CN | 101239881 A | 8/2008 |
| EP | 0 308 809 | 3/1989 |

(Continued)

OTHER PUBLICATIONS

International Search Report and Written Opinion dated Jul. 10, 2019 for International Application No. PCT/US2019/014429, 20 pages.

(Continued)

*Primary Examiner* — Fred M Teskin
(74) *Attorney, Agent, or Firm* — McDonnell Boehnen Hulbert & Berghoff LLP

(57) ABSTRACT

Disclosed are low-temperature thermally and/or ultraviolet light curable polymers that can be used as active and/or passive organic materials in various electronic, optical, and optoelectronic devices. In some embodiments, the device can include an organic semiconductor layer and a dielectric layer prepared from such low-temperature thermally and/or ultraviolet light curable polymers. In some embodiments, the device can include a passivation layer prepared from the low-temperature thermally and/or ultraviolet light curable polymers described herein. In certain embodiments, a polymer of the disclosure has a repeating unit having the structure (I) in which $Q^1$-$Q^2$ and $Q^3$-$Q^4$ are each independently —C(H)=C(H)— or (II) in which each n is indepen-
(Continued)

dently selected from 1, 2, 3 and 4, and the polymer includes at least one repeating unit of Formula (I) wherein $Q^1$-$Q^2$ and $Q^3$-$Q^4$ is (II).

20 Claims, 13 Drawing Sheets

(52) U.S. Cl.
CPC ............. *C08G 2261/1642* (2013.01); *C08G 2261/3325* (2013.01); *C08G 2261/418* (2013.01); *C08G 2261/65* (2013.01); *C08G 2261/72* (2013.01); *C08G 2261/92* (2013.01)

(56) References Cited

U.S. PATENT DOCUMENTS

| | | | |
|---|---|---|---|
| 6,310,160 B1 * | 10/2001 | Kodemura | C08F 32/08 524/553 |
| 7,820,355 B2 | 10/2010 | Kurakata | |
| 8,105,870 B2 | 1/2012 | Masuda | |
| 8,334,456 B2 | 12/2012 | Zhu | |
| 8,598,450 B2 | 12/2013 | Pan | |
| 9,082,981 B1 | 7/2015 | Lu | |
| 10,147,895 B2 | 12/2018 | Lu | |
| 2012/0056183 A1 | 3/2012 | Mueller | |
| 2012/0056249 A1 | 3/2012 | Mueller | |
| 2012/0088879 A1 | 4/2012 | Yoshiwara | |
| 2017/0104080 A1 | 4/2017 | Lu | |

FOREIGN PATENT DOCUMENTS

| | | |
|---|---|---|
| JP | 2018054928 A | 4/2018 |
| WO | 2011108533 A1 | 6/2013 |

OTHER PUBLICATIONS

Abadie et al., "New catalysts for linear polydicylodipentadiene synthesis," European Polymer Journal, 36:1213-1219 (2000).
Dall'Asta et al., "Homopolymerization of Dicyclopentadiene Induced by Ziegler-Natta Catalysts and by other Transition Metal Systems," Die Makromolekulare Chemie, 130:153-165 (1969).
STN search performed Oct. 16, 2014.
Marshall et al., "A Novel, Metal Alkyl-Free Catalyst for the Ring-Opening Polymerization of Cyclo-Olefins," European Polymer Journal, 5:29-33 (1969).
Pacreau et al., "Linear polymerization of endo-dicyclopentadiene limited by metathesis catalysts," Makromol. Chom., 188:2585-95 (1987).

* cited by examiner

ORGANIC DIELECTRIC MATERIALS AND DEVICES INCLUDING THEM

CROSS-REFERENCE TO RELATED APPLICATIONS

This application is a U.S. National Stage Application under 35 U.S.C. § 371 of International Patent Application no. PCT/US2019/014429, filed Jan. 21, 2019, which claims the benefit of priority of U.S. Provisional Patent Application No. 62/619,225, filed Jan. 19, 2018, which is hereby incorporated herein by reference in its entirety.

BACKGROUND OF THE DISCLOSURE

Field of the Disclosure

The present disclosure relates to organic dielectric materials and devices including them.

Technical Background

The past two decades have witnessed a growing interest in developing electronic devices using organic semiconductors and amorphous metal oxide semiconductors as the key component of the charge carrying layer. These devices can offer advantages such as mechanical flexibility, potentially much lower manufacturing costs, and the possibility of low-temperature ambient manufacturing processes using printing methodologies. For instance, both organic and amorphous metal oxide semiconductors can be used to enable new devices such as electronic paper, flexible organic light-emitting diodes (OLEDs), radio-frequency identification (RFID) technologies, solar cells, light emitting transistors (OLETs), and sensors.

A key benefit to using organic and amorphous metal oxide semiconductors is the potential to use solution-phase deposition techniques, although the latter also can be deposited using various vapor-phase approaches. Yet, to fully realize the processing advantages of organic or amorphous metal oxide semiconductors, all active components of the device should be mechanically flexible and preferably, most of the components of the device should be compatible with, if not processable by, solution-phase deposition fabrication.

Thin-film transistors (TFTs) based upon various solution-processed organic semiconductors as well as solution-processed or vapor-deposited metal oxide semiconductors have been developed as key components of the circuits driving these devices. However, a critical material in TFTs is the dielectric layer, which serves as the gate electrical insulator material. This material should exhibit low-gate leakage properties and large dielectric strength as well as to be air and moisture-stable, and should be robust enough to withstand various conditions that are common in device fabrication processes, with properties that are tunable depending on the type of semiconductor employed in the TFT charge transporting layer. Furthermore, to enable a robust fabrication process and stable device operation, optimization of the multilayer TFT structure by using appropriate material combinations is necessary. Consequently, the substrate surface should be treated or coated to be compatible with the overlying layers fabricated on top of it. The semiconductor (the layer within which charge transport occurs) is desirably uniformly deposited. If the semiconductor is inorganic, amorphous materials usually are employed; and if the semiconductor is organic, additives typically are used in the formulation to facilitate coating. In addition, after the device is completed, a top layer is used to protect the TFT stack from the environment during operation, which increases storage and operation stability of the TFT.

Accordingly, there is a desire in the art to design and synthesize new organic materials that are compatible with diverse substrates, gate contacts, and/or semiconductor materials such that they could be employed in the whole TFT fabrication process to meet one or more device requirements including low current leakage densities, tuned surface energies, good adhesion, good solution-processability, and/or low permeation to water.

SUMMARY OF THE DISCLOSURE

In light of the foregoing, the present disclosure provides organic materials that possess one or more desirable properties and characteristics which make them suitable for use, for example, as dielectric layers, in an electronic device such as field-effect transistors.

In one aspect, a polymer of the disclosure includes a repeating unit of Formula (I):

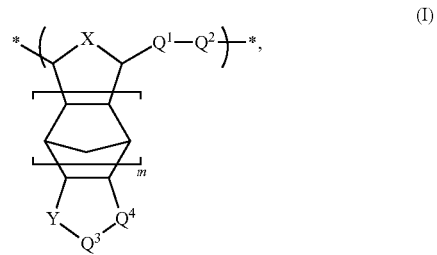

wherein in each repeating unit,

X is independently selected from the group consisting of —$CH_2$—, —CHR—, —$CR_2$—, —C(O), —$SiH_2$—, —SiHR—, —$SiR_2$—. —NH—, —NR—, —O— and —S—;

Y is independently absent or selected from the group consisting of —$CH_2$—, —CHR—, —$CR_2$—, —C(O), —$SiH_2$—, —SiHR—, —$SiR_2$—. —NH—, —NR—, —O— and —S—;

R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$alkyl group, a $C_{1-10}$haloalkyl group, and an optionally substituted aryl or heteroaryl group, wherein $R^3$ is a $C_{1-10}$alkyl group or a —Si($C_{1-10}$alkyl)$_3$ group, and $R^4$ and $R^5$ independently are hydrogen or a $C_{1-10}$alkyl group; and m is independently 0, 1 or 2, $Q^1$-$Q^2$ and $Q^3$-$Q^4$ are each independently —C(H)=C(H)— or

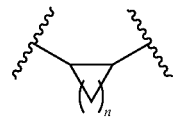

in which each n is independently selected from 1, 2, 3 and 4, provided that the polymer includes at least one repeating unit of Formula (I) wherein $Q^1$-$Q^2$ or $Q^3$-$Q^4$ is

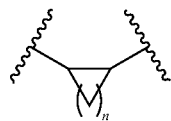

Notably, in advantageous embodiments, such materials can be solution-deposited then subsequently thermally cured into physically robust and ambient-stable thin films.

Another aspect of the disclosure is an organic material comprising a polymer as described herein and/or a crosslinking reaction product thereof.

In other aspects, the present disclosure provides compositions that can be used to prepare the organic materials described above using a solution-phase process, as well as electronic devices that include the organic materials described herein.

Methods for preparing the present polymers, organic materials comprising the present polymers and/or crosslinking reaction products, and electronic devices that incorporate organic materials comprising the present polymers and/or crosslinking reaction products also are provided and are within the scope of the present teachings.

The foregoing as well as other aspects and embodiments of the present disclosure will be more fully understood from the following figures, description, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
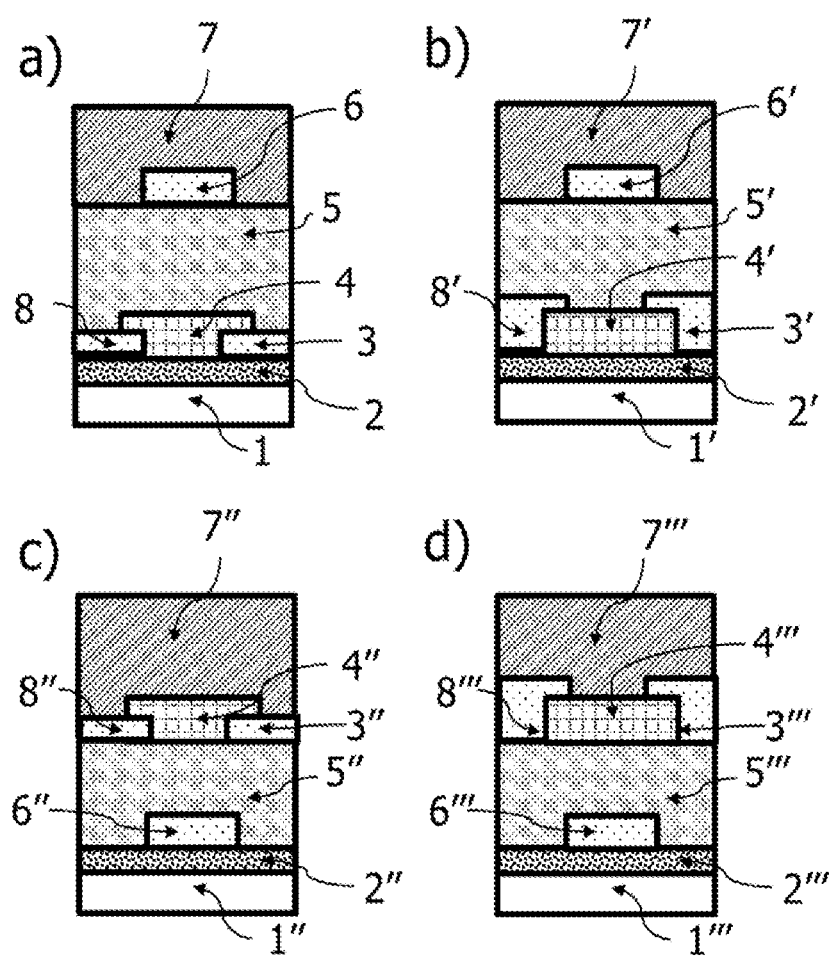
FIG. 1 illustrates the four common types of FET structures: (a) bottom-contact top-gate structure, (b) top-contact top-gate structure, (c) bottom-gate bottom-contact structure, and (d) bottom-gate top-contact structure.

The present disclosure relates to organic materials that can be used, for example, as materials (e.g., as dielectric layers) in a wide variety of electronic, optical, and optoelectronic devices such as thin film transistors (TFTs), specifically, organic field-effect transistors (OFETs), metal oxide field-effect transistor (MOFETs), as well as sensors, capacitors, unipolar circuits, complementary circuits (e.g., inverter circuits), and the like.

In one aspect, an organic material of the disclosure includes a polymer (e.g., a linear polymer) and/or a cross-linking reaction product thereof. In certain desirable embodiments, the polymer can be solution-processed into thin films, where the thin films subsequently can be thermally cured (and optionally also photocrosslinked) into physically robust and ambient-stable active or passive materials suitable for use in various electronic, optical, and optoelectronics devices. For example, in certain embodiments an organic material according to the present teachings can be used (either by itself or with at least one other dielectric material) as the dielectric layer in a thin film transistor, as a passivation material (for example, to encapsulate the source and drain electrodes in a transistor), as an interfacial material (for example, a surface-modifying interlayer), as a photoresist for patterning a semiconductor layer, or as an inert component in the semiconductor layer.

When used as a dielectric material, various embodiments of the present organic materials can exhibit one or more of a wide range of desirable properties and characteristics including, but not limited to, low leakage current densities, high breakdown voltages, low current-voltage hysteresis, tuned dielectric constant or capacitance values, uniform film thickness, solution-processability, fabricability at low temperatures and/or atmospheric pressures, air and moisture stability, and/or compatibility with diverse gate materials and/or semiconductors. When used as passivation or interfacial materials, various embodiments of the present organic materials can exhibit one or more desirable properties and characteristics including, but not limited to, high glass transition temperature, high optical clarity, low shrinkage, low moisture absorption, low oxygen penetration, adhesion, uniform film thickness, solution-processability, fabricability at low temperatures and/or atmospheric pressures, and good adhesion to adjacent materials.

As used herein, when compositions are described as "having," "including," or "comprising" specific components, or where processes are described as "having," "including," or "comprising" specific process steps, it is contemplated that compositions of the present teachings also consist essentially of, or consist of, the recited components, and that the processes of the present teachings also consist essentially of, or consist of, the recited process steps.

As used herein, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_zH_{2z+1-t}X^0_t$, where $X^0$, at each occurrence, is F, Cl, Br or I, z is an integer in the range of 1 to 40, and t is an integer in the range of 1 to 81, provided that t is less than or equal to $2z+1$. Haloalkyl groups that are not perhaloalkyl groups can be substituted as described herein.

As used herein, "alkoxy" refers to —O— alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O— alkyl group can be substituted as described herein.

As used herein, "alkylthio" refers to an —S— alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S— alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cyclic" refers to an organic closed-ring group including cycloalkyl groups, aryl groups, cycloheteroalkyl groups, and heteroaryl groups as defined herein.

As used herein, "cycloalkyl" refers to a non-aromatic carbocyclic group including cyclized alkyl, cyclized alkenyl, and cyclized alkynyl groups. In various embodiments, a cycloalkyl group can have 3 to 40 carbon atoms (i.e., $C_{3-40}$ cycloalkyl group), for example, 3 to 20 carbon atoms. A cycloalkyl group can be monocyclic (e.g., cyclohexyl) or polycyclic (e.g., containing fused, bridged, and/or spiro ring systems), where the carbon atoms are located inside the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5] decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 40 ring atoms (i.e., 3-40 membered cycloheteroalkyl group), for example, 3 to 20 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 40 carbon atoms in its ring system, which can include multiple fused rings. In some embodiments, a polycyclic aryl group can have from 8 to 40 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 40 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

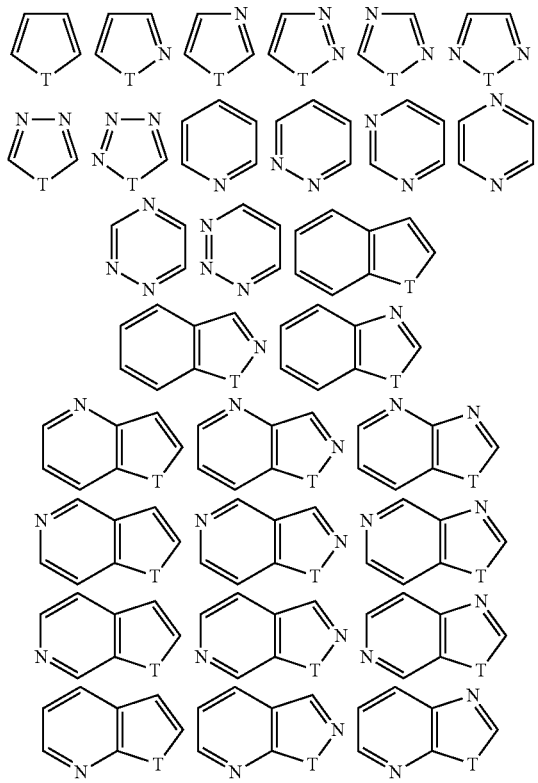

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

At various places in the present specification, substituents on a chemical group are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, a "dielectric material" has a conductivity in the order of $10^{-6}$ S·cm$^{-1}$ or less to avoid current leakage to an adjacent electrical conductor.

It will be understand that when two components are described as being coupled to each other, the two components can be directly in contact (e.g., directly coupled to each other), or the two components can be coupled to each other via one or more intervening components or layers.

Throughout the specification, a specific stereoisomer may be presented when multiple stereoisomers are possible. In such cases, the specific stereoisomer presented should be understood to represent the different possible stereoisomers, unless explicitly stated otherwise. For example, a depiction of a cis-isomer should be understood to represent both the cis- and the trans-isomers, and vice versa.

The present polymers generally can be obtained (e.g., in linear form) via ring-opening metathesis polymerization using a polycyclic monomer having at least two unsaturated bonds. In certain embodiments, the polycyclic monomer comprises an optionally substituted norbornene moiety (or a heteroatom derivative thereof), which includes a first unsaturated bond, fused with at least one ring comprising a second unsaturated bond.

In certain embodiments, the present polymers can comprise a repeating unit of Formula (I):

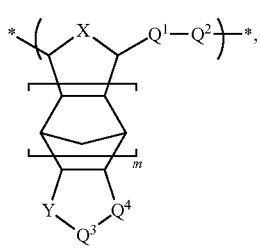

(I)

wherein in each repeating unit
X is independently selected from the group consisting of —CH$_2$—, —CHR—, —CR$_2$—, —C(O)—, —SiH$_2$—, —SiHR—, —SiR$_2$—, —NH—, —NR—, —O— and —S—;
Y is independently absent or selected from the group consisting of —CH$_2$—, —CHR—, —CR$_2$—, —C(O)—, —SiH$_2$—, —SiHR—, —SiR$_2$—, —NH—, —NR—, —O— and —S—;
R is independently selected from the group consisting of a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$alkyl group, a C$_{1-10}$haloalkyl group, and an optionally substituted aryl or heteroaryl group, wherein R$^3$ is a C$_{1-10}$ alkyl group or a —Si(C$_{1-10}$alkyl)$_3$ group, and R$^4$ and R$^5$ independently are hydrogen or a C$_{1-10}$alkyl group; and
m is independently 0, 1 or 2,
Q$^1$-Q$^2$ and Q$^3$-Q$^4$ are each independently —C(H)=C(H)— or

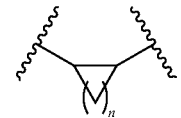

in which each n is independently selected from 1, 2, 3 and 4,
provided that the polymer includes at least one repeating unit of Formula (I) wherein Q$^{1-}$-Q$^2$ or Q$^3$-Q$^4$ is

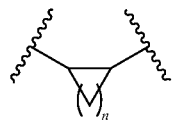

The percentage of Q$^1$-Q$^2$ and Q$^3$-Q$^4$ that are

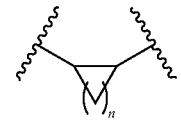

(i.e., "1,2-cycloalkanediyl") as opposed to —C(H)=C(H)— (ethenediyl) is an indicator of the degree of cycloalkanation of the polymer. The degree of cycloalkanation can be decreased for more effective crosslinking of the polymer, or can be increased for better air stability (i.e., resulting from decreased oxidation) and lower dielectric constant; based on the disclosure herein the person of ordinary skill in the art will select a degree of cycloalkanation that will provide the desired properties. In some embodiments, at least 40% of the Q$^1$-Q$^2$ and Q$^3$-Q$^4$ groups are 1,2-cycloalkanediyl, e.g., at least 45%, at least 50%, at least 60%, at least 70% or at least 80%. In other embodiments, at least 10% of the Q$^1$-Q$^2$ and Q$^3$-Q$^4$ groups are 1,2-cycloalkanediyl, e.g., at least 20%, at least 30% or at least 40%. And in some embodiments, including certain embodiments mentioned in the preceding two sentences, no more than 95%, e.g., no more than 90%, no more than 80%, or no more than 70% of the Q$^1$-Q$^2$ and Q$^3$-Q$^4$ groups are 1,2-cycloalkanediyl.

Thus, in certain embodiments of the materials as otherwise described herein, 5-95% of the $Q^1$-$Q^2$ and $Q^3$-$Q^4$ groups are 1,2-cycloalkanediyl, e.g., 5-90%, or 5-80%, or 5-70%, or 5-60%, or 5-55%, or 5-50%, or 10-95%, or 10-90%, or 10-80%, or 10-70%, or 10-60%, or 10-55%, or 10-50%, or 20-95%, or 20-90%, or 20-80%, or 20-70%, or 20-60%, or 20-55%, or 20-50%, or 30-95%, or 30-90%, or 30-80%, or 30-70%, or 30-60%, or 30-55%, or 30-50%, or 40-95%, or 40-90%, or 40-80%, or 40-70%, or 40-60%, or 40-55%, or 40-50%, or 45-95%, or 45-90%, or 45-80%, or 45-70%, or 45-60%, or 45-55%, or 45-50%, or 50%-95%, or 50-90%, or 50-80%, or 50-70%, or 50-60%, or 50-55%.

Likewise, in some embodiments, no more than 30% of the $Q^1$-$Q^2$ and $Q^3$-$Q^4$ groups are ethenediyl, e.g., no more than 20% or no more than 10%. In other embodiments, no more than 60% of the $Q^1$-$Q^2$ and $Q^3$-$Q^4$ groups are ethenediyl, e.g., no more than 55%, or no more than 50%, or no more than 40%. In other embodiments, no more than 90% of the $Q^1$-$Q^2$ and $Q^3$-$Q^4$ groups are ethenediyl, e.g., no more than 80% or no more than 70%. And in some embodiments, including certain embodiments mentioned in the preceding three sentences, at least 5%, e.g., at least 10%, at least 20%, or at least 30% of the $Q^1$-$Q^2$ and $Q^3$-$Q^4$ groups are ethenediyl.

Thus, in certain embodiments of the materials as otherwise described herein, 5-95% of the $Q^1$-$Q^2$ and $Q^3$-$Q^4$ groups are ethenediyl, e.g., 5-90%, or 5-80%, or 5-70%, or 5-60%, or 5-55%, or 5-50%, or 10-95%, or 10-90%, or 10-80%, or 10-70%, or 10-60%, or 10-55%, or 10-50%, or 20-95%, or 20-90%, or 20-80%, or 20-70%, or 20-60%, or 20-55%, or 20-50%, or 30-95%, or 30-90%, or 30-80%, or 30-70%, or 30-60%, or 30-55%, or 30-50%, or 40-95%, or 40-90%, or 40-80%, or 40-70%, or 40-60%, or 40-55%, or 40-50%, or 45-95%, or 45-90%, or 45-80%, or 45-70%, or 45-60%, or 45-55%, or 45-50%, or 50%-95%, or 50-90%, or 50-80%, or 50-70%, or 50-60%, or 50-55%.

In some embodiments, the polymer of Formula (I) can have the structure of Formulae (Ia)-(If):

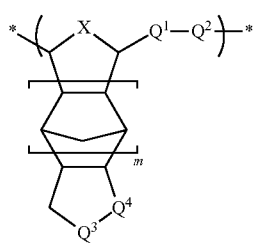

(Ia)

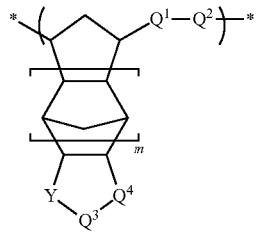

(Ib)

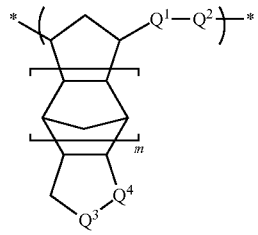

(Ic)

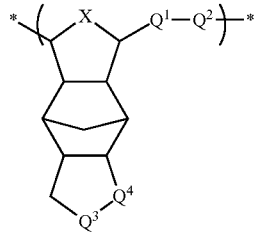

(Id)

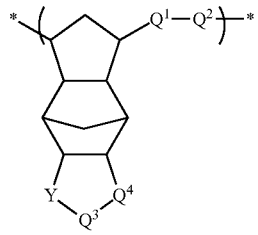

(Ie)

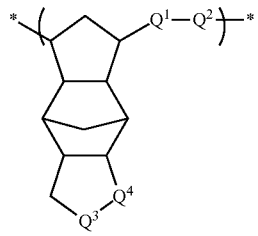

(If)

In certain embodiments, the present polymers can be represented by Formula (Ig):

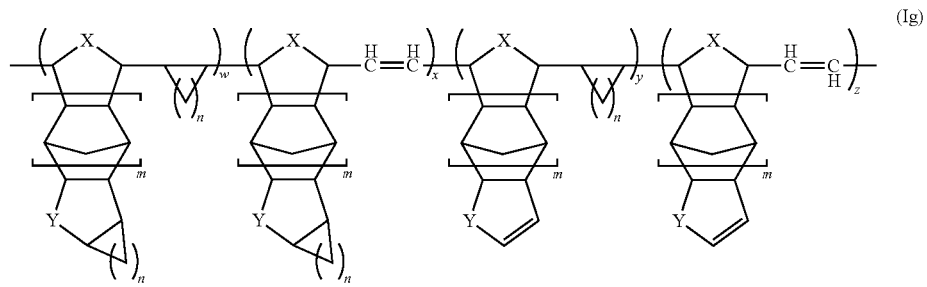

(Ig)

wherein each of w, x, y is in the range of 0-100% of the number of monomeric units of the polymer and z is in a range from 0 to nearly 100% of the number of monomeric units of the polymer (i.e., but is not 100%, such that there is some degree of cycloalkanation), and the sum of w, x, y and z is at least 80% of the number of monomeric units of the polymer where $R^1$, $R^2$, X, Y, and m are as defined herein. In some embodiments, the sum of w, x, y and z is at least 90% of the number of monomeric units of the polymer, e.g., at least 95% or even at least 99%.

The values of x, y and z is an indicator of the degree of cycloalkanation of the polymer. The values of x, y and z may be increased for more effective crosslinking of the polymer, or can be decreased for better air stability (i.e., decreased oxidation). Based on the disclosure herein the person of ordinary skill in the art will select a degree of cyclopropanation that will provide the desired properties.

Accordingly, in some embodiments, the value of z is no more than 30% of the number of the monomeric units of the polymer, e.g., no more than 20% or no more than 10%. In other embodiments, the value of z is no more than 60% of the number of the monomeric units of the polymer, e.g., no more than 50% or no more than 40%. In other embodiments, the value of z is no more than 90% of the number of the monomeric units of the polymer, e.g., no more than 80% or no more than 70%. But in certain embodiments, the value of z is at least 5% of the number of the monomeric units of the polymer, e.g., at least 10% or even at least 20%. In certain embodiments, the value of z is in the range of 5-90%, or 5-80%, or 5-70%, or 5-60%, or 5-50%, or 5-40%, or 5-30%, or 10-90%, or 10-80%, or 10-70%, or 10-60%, or 10-50%, or 10-40%, or 10-30%, or 20-90%, or 20-80%, or 20-70%, or 20-60%, or 20-50%, or 20-40% of the number of the monomeric units of the polymer.

The degree of cycloalkanation of the polymer may be evaluated by determining the molar ratio of 1,2-cycloalkanediyl moieties to the sum of 1,2-cycloalkanediyl and ethenediyl moieties in the polymer. That is, instead of evaluating the percentage of cycloalkanation based on the value of z, the percentage of cycloalkanation can be evaluated as a ratio of cycloalkane moieties to the sum of cycloalkane and alkene moieties, by using proton NMR (i.e., based on the difference in NMR chemical shifts for the ethenediyl protons and the 1,2-cycloalkanediyl protons). This method takes into account the 1,2-cycloalkanediyl groups in units w, x and y and the ethenediyl groups in units x, y and z of the polymer. In certain embodiments of the materials as otherwise described herein, the ratio of 1,2-cycloalkanediyl moieties to the sum of 1,2-cycloalkanediyl and ethenediyl moieties ranges from 5% to 95%. In certain such embodiments, the ratio of 1,2-cycloalkanediyl moieties to the sum of 1,2-cycloalkanediyl and ethenediyl moieties is 5-90%, or 5-80%, or 5-70%, or 5-60%, or 5-55%, or 5-50%, or 10-95%, or 10-90%, or 10-80%, or 10-70%, or 10-60%, or 10-55%, or 10-50%, or 20-95%, or 20-90%, or 20-80%, or 20-70%, or 20-60%, or 20-55%, or 20-50%, or 30-95%, or 30-90%, or 30-80%, or 30-70%, or 30-60%, or 30-55%, or 30-50%, or 40-95%, or 40-90%, or 40-80%, or 40-70%, or 40-60%, or 40-55%, or 40-50%, or 45-95%, or 45-90%, or 45-80%, or 45-70%, or 45-60%, or 45-55%, or 45-50%, or 50%-95%, or 50-90%, or 50-80%, or 50-70%, or 50-60%, or 50-55%.

Similarly, in certain embodiments, the value of x is no more than 40% of the number of the monomeric units of the polymer, e.g., no more than 25% or no more than 10%. In certain embodiments, the value of x is at least 2% of the number of the monomeric units of the polymer, e.g., at least 5% or even at least 10%. In certain embodiments, the value of x is in the range of 2-40%, or 2-25%, or 2-10%, or 5-40%, or 5-25%, or 10-40% or 10-25% of the number of the monomeric units of the polymer.

And, in certain embodiments, the value of y is no more than 40% of the number of the monomeric units of the polymer, e.g., no more than 25% or no more than 10%. In certain embodiments, the value of x is at least 2% of the number of the monomeric units of the polymer, e.g., at least 5% or even at least 10%. In certain embodiments, the value of x is in the range of 2-40%, or 2-25%, or 2-10%, or 5-40%, or 5-25%, or 10-40% or 10-25% of the number of the monomeric units of the polymer.

In certain embodiments, the value of w is no more than 30% of the number of the monomeric units of the polymer, e.g., no more than 20% or no more than 10%. In other embodiments, the value of z is no more than 60% of the number of the monomeric units of the polymer, e.g., no more than 50% or no more than 40%. In other embodiments, the value of w is no more than 90% of the number of the monomeric units of the polymer, e.g., no more than 80% or no more than 70%. But in certain embodiments, the value of w is at least 5% of the number of the monomeric units of the polymer, e.g., at least 10%, at least 20%, at least 30% or even at least 40%. In certain embodiments, the value of w is in the range of 5-90%, or 5-80%, or 5-70%, or 5-60%, or 5-50%, or 5-40%, or 5-30%, or 10-90%, or 10-80%, or 10-70%, or 10-60%, or 10-50%, or 10-40%, or 10-30%, or 10-90%, or 10-80%, or 10-70%, or 10-60%, or 10-50%, or 10-40%, or 20-90%, or 20-80%, or 20-70%, or 20-60%, or 20-50%, or 20-40%, or 30-90%, or 30-80%, or 30-70%, or 30-60%, or 30-50%, or 40-90%, or 40-80%, or 40-70%, or 40-60% of the number of the monomeric units of the polymer.

In some embodiments, the value of n may be selected to provide polymers having different ring systems. For example, n can be 1 (i.e., to form a 1,2-cyclopropanediyl), 2 (1,2-cyclobutanediyl), 3, (1,2-cyclopentanediyl) or 4 (1,2-cyclohexanediyl).

The value of n can vary within the polymer (i.e., the repeating units of the polymer having different values for n), or the value of n can be the same in each of the repeating units. In some embodiments n is 1. In other embodiments, n is 2. In some embodiments, n is 1 or 2, 2 or 3, 1-3, or 3 or 4. In some examples, at least 50% of the values of n are 1, e.g., at least 70%, at least 90% or at least 95%. In other examples, at least 50% of the values of n are 2, e.g., at least 70%, at least 90% or at least 95%. While in other embodiments, at least 50% of the values of n are 3 or 4, e.g., at least 70%, at least 90% or at least 95%.

The value of m can be selected to vary the fused ring system at the core or the polymer.

The value of m can vary within the polymer (i.e., the repeating units of the polymer having different values for m), or the value of m can be the same in each repeating unit. In some embodiments m is 0. In other embodiments, m is 1. In some embodiments, m is 2. In some examples, at least 50% of the values of m are 0, e.g., at least 70%, at least 90% or at least 95%. In other examples, at least 50% of the values of m are 1, e.g., at least 70%, at least 90% or at least 95%. In other examples, at least 50% of the values of m are 0 or 1, e.g., at least 70%, at least 90% or at least 95%. While in other embodiments, no more than 50% of the values of m are 2, e.g., no more than 30%, no more than 20%, or no more than 10%.

In preferred embodiments, X is selected from any of groups (1a)-(11):

(1a) Each X is independently selected from the group consisting of —$CH_2$—, —CHR—, —$CR_2$—, —C(O)—, —$SiH_2$—, —SiHR—, —$SiR_2$—, —NH—, —NR—, —O— and —S—.

(1b) Each X is independently selected from the group consisting of —$CH_2$—, —CHR—, —$CR_2$—, —C(O)—, —NH—, —NR—, —O— and —S—.
(1c) Each X is independently selected from the group consisting of —$CH_2$—, —CHR—, —$CR_2$—, —$SiH_2$—, —SiHR—, —$SiR_2$—, —NH—, —NR—, —O— and —S—.
(1d) Each X is independently selected from the group consisting of —$CH_2$—, —$SiH_2$—, —SiHR—, —$SiR_2$—, —NH—, —NR—, —O— and —S—.
(1e) Each X is independently selected from the group consisting of —$CH_2$—, —CHR—, —$SiH_2$—, —SiHR—, —NH—, —NR—, —O— and —S—.
(1f) Each X is independently selected from the group consisting of —$CH_2$—, —$SiH_2$—, —NH—, —O— and —S—.
(1g) Each X is independently selected from the group consisting of —$CH_2$—, —NH—, —NR—, —O— and —S—.
(1h) Each X is independently selected from the group consisting of —$CH_2$—, —NH— and —O—.
(1i) Each X is independently selected from the group consisting of —$CH_2$— and —O—.
(1j) Any of groups (1a)-(1l), wherein at least 70% of the X groups are the same, e.g., at least 80%, at least 90%, or even at least 95%.
(1k) Each X is —$CH_2$—.
(1l) Each X is —O—.

In preferred embodiments, Y is selected from any of groups (2a)-(2m):
(2a) Each Y is independently selected from the group consisting of —$CH_2$—, —CHR—, —$CR_2$—, —C(O)—, —$SiH_2$—, —SiHR—, —$SiR_2$—, —NH—, —NR—, —O— and —S—;
(2b) Each Y is independently selected from the group consisting of —$CH_2$—, —CHR—, —$CR_2$—, —C(O)—, —$SiH_2$—, —SiHR—, —$SiR_2$—, —NH—, —NR— and —O—.
(2c) Each Y is independently selected from the group consisting of —$CH_2$—, —CHR—, —$CR_2$—, —C(O)—, —NH—, —NR—, —O— and —S—.
(2d) Each Y is independently selected from the group consisting of —$CH_2$—, —CHR—, —$CR_2$—, —$SiH_2$—, —SiHR—, —$SiR_2$—, —NH—, —NR—, —O— and —S—.
(2e) Each Y is independently selected from the group consisting of —$CH_2$—, —$SiH_2$—, —SiHR—, —$SiR_2$—, —NH—, —NR—, —O— and —S—.
(2f) Each Y is independently selected from the group consisting of —$CH_2$—, —CHR—, —$SiH_2$—, —SiHR—, —NH—, —NR—, —O— and —S—.
(2g) Each Y is independently selected from the group consisting of —$CH_2$—, —$SiH_2$—, —NH—, —O— and —S—.
(2h) Each Y is independently selected from the group consisting of —$CH_2$—, —NH—, —NR—, —O— and —S—.
(2i) Each Y is independently selected from the group consisting of —$CH_2$—, —NH— and —O—.
(2j) Each Y is independently selected from the group consisting of —$CH_2$— and —O—.
(2k) Any of groups (2a)-(2j), wherein at least 70% of the Y groups are the same, e.g., at least 80%, at least 90%, or even at least 95%.
(2l) wherein Each Y is —$CH_2$—.
(2m) wherein Each Y is —O—.

In preferred embodiments, R is selected from any of groups (3a)-(3k):
(3a) Each R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$alkyl group, a $C_{1-10}$haloalkyl group, and an optionally substituted aryl or heteroaryl group, wherein $R^3$ is a $C_{1-10}$alkyl group, and $R^4$ and $R^5$ independently are hydrogen or a $C_{1-10}$alkyl group.
(3b) Each R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$haloalkyl group, and an optionally substituted aryl or heteroaryl group, wherein $R^3$ is a $C_{1-10}$alkyl group, and $R^4$ and $R^5$ independently are hydrogen or a $C_{1-10}$alkyl group.
(3c) Each R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$haloalkyl group, and an optionally substituted aryl or heteroaryl group, wherein $R^3$ is a $C_{1-10}$alkyl group, and $R^4$ and $R^5$ are hydrogen.
(3d) Each R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$alkyl group, a $C_{1-10}$haloalkyl group, and an optionally substituted aryl or heteroaryl group, wherein $R^3$ is a $C_{1-10}$alkyl group, and $R^4$ and $R^5$ are hydrogen.
(3e) Each R is independently selected from the group consisting of a halogen, —$OR^3$, a $C_{1-10}$alkyl group, a $C_{1-10}$haloalkyl group, and an optionally substituted aryl or heteroaryl group, wherein $R^3$ is a $C_{1-10}$alkyl group.
(3f) Each R is independently selected from the group consisting of a halogen, —$OR^3$, a $C_{1-10}$alkyl group and a $C_{1-10}$haloalkyl group, wherein $R^3$ is a $C_{1-10}$alkyl group.
(3g) Each R is independently selected from the group consisting of a halogen, a $C_{1-10}$alkyl group and a $C_{1-10}$haloalkyl group.
(3h) Each R is independently a halogen.
(3i) Each R is independently a $C_{1-10}$alkyl group.
(3j) Each R is independently a $C_{1-10}$haloalkyl group.
(3k) Any of groups (3a)-(3j), wherein at least 70% of the R groups are the same, e.g., at least 80%, at least 90%, or even at least 95%.

In certain embodiments, the polymers of the disclosure can be represented by Formula (Ih):

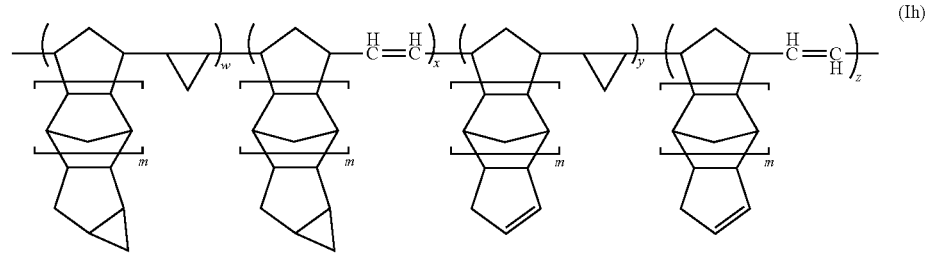

(Ih)

wherein each of m, w, x, y and z are as defined herein.

In certain embodiments, the polymers of the disclosure can be represented by Formula (Ii):

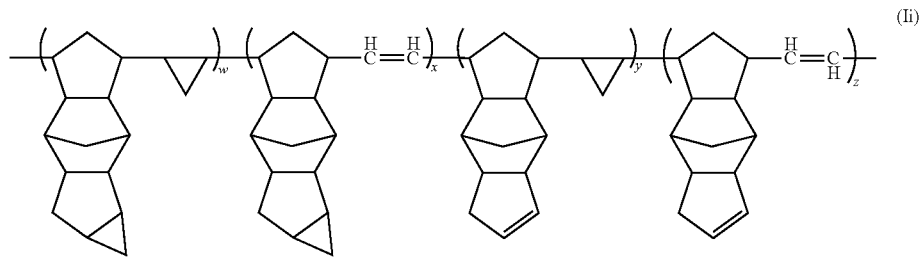

wherein each of m, w, x, y and z are as defined herein.

Also disclosed are methods for preparing the polymers of the disclosure, organic materials comprising the polymers of the disclosure, and electronic devices that incorporate organic materials comprising the polymers of the disclosure. The polymers of the disclosure can be made by cycloalkanating a plurality of double bonds of a precursor polymer, wherein the precursor polymer has a repeating unit having the structure of Formula (II):

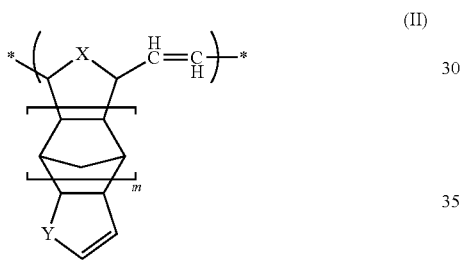

wherein

X is selected from the group consisting of —$CH_2$—, —CHR—, —$CR_2$—, —C(O), —$SiH_2$—, —SiHR—, —$SiR_2$—, —NH—, —NR—, —O— and —S—;

Y is absent or selected from the group consisting of —$CH_2$—, —CHR—, —$CR_2$—, —C(O), —$SiH_2$—, —SiHR—, —$SiR_2$—, —NH—, —NR—, —O— and —S—;

R is selected from the group consisting of a halogen, —$OR^3$, —C(O)$OR^3$, —OC(O)$R^3$, —$NR^4R^5$, —C(O)$NR^4R^5$, —OC(O)$NR^4R^5$, a $C_{1-10}$alkyl group, a $C_{1-10}$haloalkyl group, and an optionally substituted aryl or heteroaryl group, wherein $R^3$ is a $C_{1-10}$alkyl group or a —Si($C_{1-10}$alkyl)$_3$ group, and $R^4$ and $R^5$ independently are hydrogen or a $C_{1-10}$alkyl group; and m is 0, 1 or 2.

The person of ordinary skill in the art will appreciate that the precursor polymer can include other repeating units. In certain desirable embodiments, at least 80% of the repeating units of the precursor polymer are as described with respect to Formula (II).

In some embodiments, the method includes a precursor polymer of Formula (II) where X, Y, R and m are as described for a polymer of Formula (I).

In some embodiments, the precursor polymer of Formula (II) can have the structure of Formulae (IIa)-(IIf):

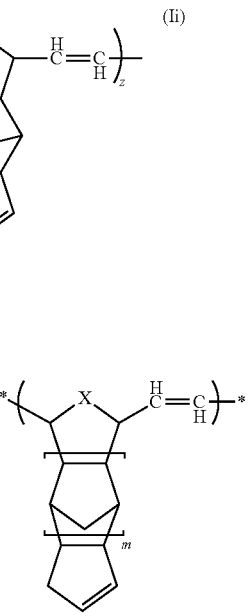

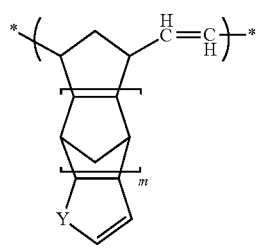

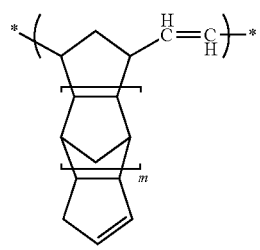

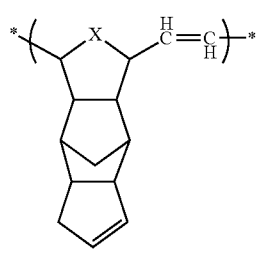

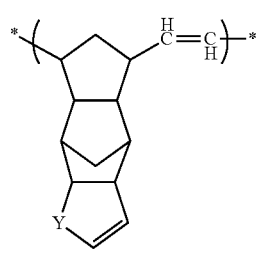

-continued

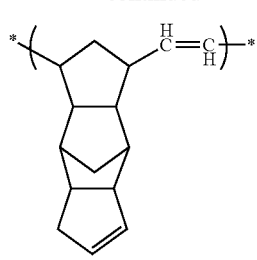

(IIf)

In some embodiments, the precursor polymer of Formula (II) can be represented by the structure of Formula (IIg):

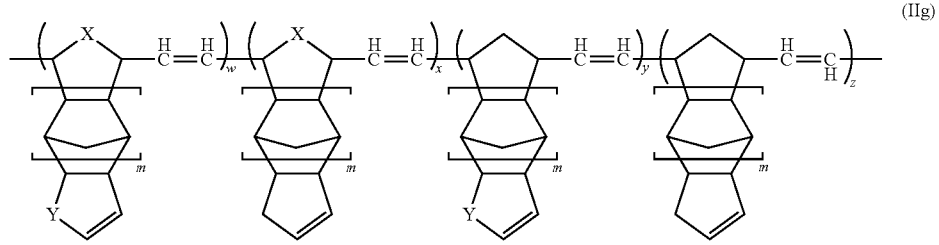

(IIg)

wherein each of w, x, y and z is in the range of 0-100% of the number of monomeric units of the precursor polymer, and the sum of w, x, y and z is at least 80% of the number of monomeric units of the precursor polymer.

In other embodiments, the precursor polymer of Formula (II) can be represented by the structure of Formula (IIh):

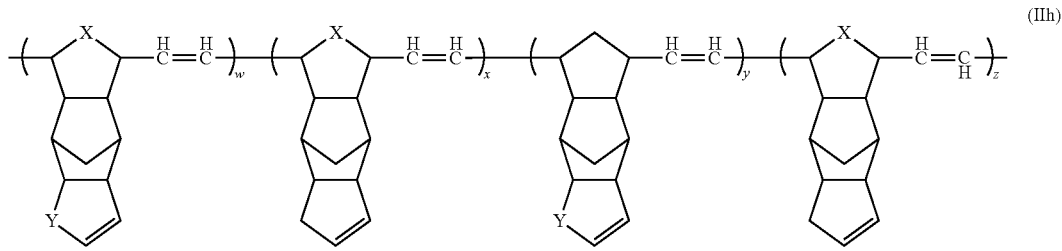

(IIh)

wherein each of w, x, y and z is in the range of 0-100% of the number of monomeric units of the precursor polymer, and the sum of w, x, y and z is at least 80% of the number of monomeric units of the precursor polymer.

The method of cycloalkanation can be selected to provide the desired ring size in the resulting polymer. For example, the cycloalkanation can be a cyclopropanation, and can be performed by reacting double bonds of the polymer with diiodomethane, e.g., in the presence of a metal catalyst. The cycloalkanation may also provide polymers having larger ring systems, e.g., cyclobutane, cyclopentane or cyclohexane rings. In some embodiments, cyclobutane rings can be incorporated by reacting any a precursor polymer of Formulae (II)-(IIh) with ethylene. Similarly, a substituted ethylene, e.g., ethyl acrylate, can afford a polymer having substituted cyclobutane rings, which can undergo one-carbon ring homologation to provide cyclopentane rings (Example 3). Polymers having cyclohexane rings can be formed through the Diels-Alder cyclization of a precursor polymer of Formulae (II)-(IIh) with a siloxy diene, followed by hydrolysis and Wolff-Kishner reduction (Example 4).

In some embodiments, the polymer is functionalized (e.g., end-functionalized) with a photocrosslinkable moiety. Functionalization may be utilized for enhanced crosslinking of the present polymers. Examples of suitable photocrosslinkable moieties include acrylate and cinnamate groups. The person of ordinary skill in the art will provide functionalization, e.g., by using a functionalized norbornene or by conventional end-functionalizing reactions.

The solubility characteristics of the polymers described herein (before and after crosslinking) can in some embodiments be selected to make them useful in electronic, optical, and optoelectronics devices. Prior to crosslinking, the optionally functionalized polymers of the disclosure can in many embodiments be soluble in common organic solvents but can become significantly less soluble or even insoluble in the same solvents after undergoing crosslinking. As used herein, a compound can be considered soluble in a solvent when at least 1 mg of the compound can be dissolved in 1 ml of the solvent. Compounds wherein less than 1 mg of the compound can be homogeneously dissolved in 1 ml of the solvent are considered insoluble.

More specifically, in certain embodiments the polymers of the disclosure can have satisfactory solubility in various common organic solvents, thereby affording formulations that are suitable for solution-phase processes. In certain embodiments, the present polymers can have satisfactory solubility in organic solvents that are orthogonal to those solvents (e.g., aromatic or polar chlorinated solvents) typically used to process common organic semiconducting molecules or polymers. This allows, for example, the fabrication of a solution-processed top-gate transistor, where the organic solvent used to dissolve the polymers does not damage (i.e., substantially dissolve, delaminate, swell, or otherwise physically disturb) or adversely affect the semiconducting properties of an underlying organic semiconductor material. Examples of organic solvents that can be used to formulate various polymers of the disclosure include aliphatic hydrocarbons such as hexanes, cyclopentane, cyclohexane, n-nonane, n-decane, n-undecane, n-dodecane;

alcohol solvents such as methanol, ethanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole, and veratrole; and amide solvents such as N-methylpyrrolidinone and dimethylacetamide. These solvents can be used either singly or in combination, or as mixtures with water.

Accordingly, the polymers of certain embodiments of the disclosure can be mobilized in a liquid medium to provide a composition (a coating formulation) for forming a thin film material. The composition can be a solution, a dispersion, a suspension, an emulsion, or a gel, although in most embodiments, the composition is a solution or a dispersion suitable for solution-phase processes. The liquid medium can include solid and/or gaseous components, that is, the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

In addition to the present polymers, the coating formulation can include other components that can be used to selectively modify certain properties such as the viscosity of the coating formulation, or the dielectric properties, thermal stability, and/or glass transition temperature of the film material to be formed. The coating formulation also can include initiators and/or sensitizers such as those described hereinabove to modify the crosslinkability of the present polymers. Accordingly, in some embodiments, the coating formulation can include one or more additives independently selected from viscosity modulators, detergents, dispersants, binding agents, compatibilizing agents, curing agents, initiators, sensitizers, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the coating formulation can include another dielectric polymer, a metal oxide, a silane crosslinker, an acrylate crosslinker, and/or combinations thereof, which can be used to prepare a blend dielectric material. For example, metal oxide fillers can be used to provide a higher dielectric constant. Fillers that have a high dielectric constant include metal oxides such as $SiO_2$, $Al_2O_3$, $TiO_2$, and the like; nitrides such as $Si_3N_4$; and paraelectric ceramic fillers such as barium titanate, strontium titanate, and lead zirconate.

As used herein, "solution-processable" or "solution-processed" refers to the ability of a compound, for example, the present polymers, to be processed via various solution-phase processes. A coating formulation comprising a polymer of the disclosure can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For noncontact printing techniques such as inkjet printing, the solubility requirement generally can be less stringent and a solubility range as low as about 1-4 mg/ml can suffice. For gravure printing, a higher solubility range may be necessary, often in the range of about 50-100 mg/mL. Other contact printing techniques such as screen-printing and flexo printing can require even higher solubility ranges, for example, about 100-1000 mg/ml.

The resulting film can take various forms including a wafer, a layer, a sheet, or an elongated web. Thin film materials based upon a polymer according to the present teachings can be monolithic (composed of a single homogenous layer) or can have multiple sublayers, where the multiple sublayers can have identical (homogeneous) or different (heterogeneous) chemical compositions.

In some embodiments, the present polymers can be thermally cured to provide improved properties such as increased glass transition temperature ($T_g$), which can lead to enhanced thermal stability, improved adhesion, and/or smoother interface with an adjacent material (e.g., a semiconductor material). Thermal crosslinking of the polymers can involve both the unsaturated bond present in the cyclic moiety as well as the unsaturated bond in the backbone of the polymer, as well as any other crosslinkable moieties in the polymer structure. However, without wishing to be bound to any particular theory, it is believed that most of the thermal crosslinking would involve the unsaturated bond in the cyclic moiety.

As shown by the results in Example 5, the present polymers can be thermally cured at different temperatures for various period of times into a crosslinked material which is resistant to the mother solvent used to solution-process the polymer prior to thermal crosslinking. For example, the polymer can be deposited as a thin film which subsequently can be thermally cured at a temperature of lower than or about 350° C., of lower than or about 300° C., at a temperature of lower than or about 200° C., at a temperature of lower than or about 180° C., at a temperature of lower than or about 150° C., at a temperature of lower than or about 140° C., or at a temperature of lower than or about 130° C., for as brief as about 8 minutes or less, and results in a physically robust crosslinked polymeric matrix with good interfacial properties suitable for further device processing such as patterning and subsequent solution-phase processes (e.g., to form/deposit overlying layers such as the semiconductor layer in a bottom-gate TFT structure or the gate layer for a top-gate TFT structure).

In some embodiments, it can be preferable to anneal the thin film material for an extended period of time (e.g., more than or about 10 minutes, more than or about 20 minutes, or more than or about 30 minutes), for example, if a larger dielectric constant is desirable. In various embodiments, dielectric materials according to the present teachings can have a dielectric constant of at least about 2.3, preferably between about 2.5 and about 10, more preferably between about 3 and about 5.

In certain embodiments, crosslinking of the present polymers (including those embodiments that do not comprise photocrosslinkable end functional groups) can be performed by radiation. For example, exposure to ultraviolet light at a wavelength of about 250-500 nm (e.g., between about 300 nm and about 450 nm) can be used. In embodiments where the present polymers are end-functionalized (e.g., with an acrylate group), the end functional group can be used for an additional crosslinking step by radiation. For example, exposure to light of wavelength $\lambda_1$ can mostly crosslink the polymer backbone, whereas exposure to light of wavelength $\lambda_2$ can promote crosslinking of the end functional group. Crosslinking, in general, also can be achieved by other types of energy, for example, with ion beams of charged particles, and electron beams from radioactive sources. Further, in certain embodiments, initiators can be used (regardless of whether the present polymers are end-functionalized or not). For example, the initiators can be present as an additive in the coating formulation comprising the present polymers. Examples of initiators can include radical initiators such as azobisisobutyronitrile (AIBN), photoacid generators such as triphenylsulfonium triflate, radical photoinitiators such as diphenyl(2,4,6-trimethylbenzoyl)phosphine oxide (TPO), or photosensitizers such as benzophenone and 1-chloro-4-propoxy-9H-thioxanthen-9-one. Subsequent to the formation of the crosslinked matrix, the thin film material of the present teachings can be subjected to further patterning and process steps, by which additional layers, including additional dielectric, semiconductor and/or conducting layers, can be formed thereon.

In certain embodiments, the polymers of the disclosure, even without crosslinking as demonstrated by Example 5, typically have excellent electrically insulating properties and a low leakage current density, which enable their use as dielectrics. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a thin-film transistor device. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

In various embodiments, the present polymers can have very low leakage current densities as measured from standard MIS and MIM capacitor structures. As used herein, leakage currents are quantified according to the procedures described in Example 6. For example, dielectric materials prepared from a polymer according to the present teachings (e.g., including the polymer and/or a crosslinking product thereof) can have a leakage current density of less than or equal to about $1\times10^{-6}$ A/cm$^2$ at E=2 MV/cm, less than or equal to about $1\times10^{-7}$ A/cm$^2$ at E=2 MV/cm, less than or equal to about $1\times10^{-8}$ A/cm$^2$ at E=2 MV/cm, less than or equal to about $8\times10^{-9}$ A/cm$^2$ at E=2 MV/cm, less than or equal to about $7\times10^{-9}$ A/cm$^2$ at E=2 MV/cm, less than or equal to about $6\times10^{-9}$ A/cm$^2$ at E=2 MV/cm, less than or equal to about $4\times10^{-9}$ A/cm$^2$ at E=2 MV/cm, less than or equal to about $2\times10^{-9}$ A/cm$^2$ at E=2 MV/cm, or less than or equal to about $1\times10^{-9}$ A/cm$^2$ at E=2 MV/cm. Dielectric materials prepared from the present polymers also can withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

As described herein, because the present polymers can be soluble in solvents that are orthogonal to those commonly used to dissolve organic or inorganic semiconducting compounds, the present polymers can be used, in whole or in part, as the dielectric layer of a solution-processed organic field-effect transistor without the need of a protecting layer. Alternatively, they can be used as the protecting layer for the semiconductor layer when a gate dielectric processed from a solvent attacking the semiconductor layer is used. A typical field-effect transistor (FET) includes a number of layers and can be configured in various ways. For example, a FET can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

In some embodiments, a polymer of the disclosure and/or a crosslinking product thereof is present in a transistor having a semiconductor layer, a dielectric layer, source electrode, drain electrode, and gate electrode, wherein at least one of the semiconductor layer, dielectric layer, source electrode, drain electrode or gate electrode comprises the polymer and/or crosslinking product. As shown in FIG. 1, a FET can include a dielectric layer (e.g., shown as 5, 5', 5", and 5" in FIGS. 1a, 1b, 1c, and 1d, respectively), a semiconductor/channel layer (e.g., shown as 4, 4', 4", and 4" in FIGS. 1a, 1b, 1c, and 1d, respectively), a gate contact (e.g., shown as 6, 6', 6", and 6" in FIGS. 1a, 1b, 1c, and 1d, respectively), a substrate (e.g., shown as 1, 1', 1", and 1" in FIGS. 1a, 1b, 1c, and 1d, respectively), and source and drain contacts (e.g., shown as 3, 3', 3", 3", 8, 8', 8", and 8' in FIGS. 1a, 1b, 1c, and 1d, respectively). One or more optional layers also can be present. For example, an optional buffer layer can be deposited on top of the substrate to improve the wetting and crystallization of an overlying layer. An optional passivation layer can be deposited as a final layer to protect the transistor stack. An optional surface-modifying film can be disposed on the gate electrode and an optional self-assembled monolayer can be deposited on the source and drain contacts to facilitate charge injection.

Figure 2:
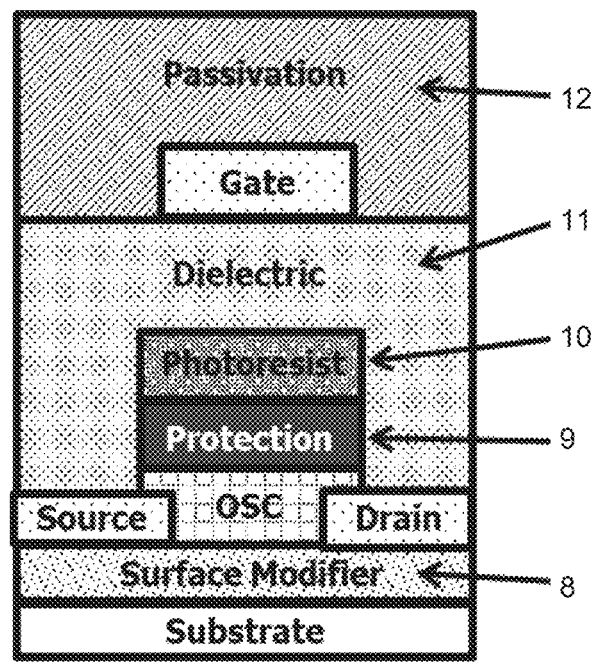
FIG. 2 shows a top-gate bottom-contact thin film transistor, illustrating that the organic materials of the present teachings can be employed as a surface modifying layer (layer 8), a protection layer (layer 9), photoresist layer (layer 10), a gate dielectric layer (layer 11), and/or a blocking/passivation/barrier/encapsulation layer (layer 12).

Using an example of a bottom-gate top-contact thin film transistor, FIG. 2 illustrates where the organic material of the present teaching can be employed: in layer 8 (as a surface modifier), layer 9 (as a protection layer), layer 10 (as a photoresist), layer 11 (as a dielectric layer), and/or layer 12 (as a blocking/passivation/barrier material). Accordingly, the present polymers can be deposited as a thin film material adjacent a semiconductor layer and function as the dielectric layer in a thin film transistor. Specifically, the thin film material can be coupled to the semiconductor thin film layer on one side and an electrically conductive component (i.e., a gate electrode) on the opposite side. The thickness of the dielectric layer typically ranges from about 10 nm to about 5000 nm, preferably from about 50 nm to about 1000 nm, and more preferably from about 200 nm to about 500 nm. In some embodiments, one or more interlayers can be present between the semiconductor layer and the dielectric layer comprising the present polymers. The interlayer(s) can be prepared from one or more dielectric polymers. In some embodiments, when the polymer is used in the surface modifying layer, the thickness of the surface modifying layer typically ranges from about 10 nm to about 5000 nm, preferably from about 50 nm to about 3000 nm, and more preferably from about 200 nm to about 2000 nm. In some embodiments, when the polymer is used in the protection layer, the thickness of the protection layer typically ranges from about 10 nm to about 5000 nm, preferably from about 20 nm to about 1000 nm, and more preferably from about 40 nm to about 100 nm. In some embodiments, when the polymer is used in the photoresist layer, the thickness of the photoresist layer typically ranges from about 10 nm to about 5000 nm, preferably from about 50 nm to about 1000 nm, and more preferably from about 100 nm to about 500 nm. In some embodiments, when the polymer is used in the passivation layer, the thickness of the passivation layer typically ranges from about 1000 nm to about 6000 nm, preferably from about 1500 nm to about 6000 nm, and more preferably from about 2000 nm to about 6000 nm.

In some embodiments, the dielectric layer can be a multi-layer laminate having two or more layers of dielectric materials sequentially deposited on top of each other (although one or more interlayers can be present), where at least one of the layers is prepared from a composition including a polymer according to the present teachings. For example, the multi-layer laminate can include at least one layer prepared from a composition including the present polymers alone in a liquid medium, and at least one layer prepared from a dielectric polymer or an inorganic (e.g., metal oxide) dielectric material. In embodiments where the dielectric material includes organic and inorganic sublayers, an interlayer can be present to improve adhesion between the sublayers.

Examples of dielectric polymers that can be used in combination with the present polymers (either in the same dielectric layer or in a separate dielectric layer) can include, without limitations, fluorinated para-xylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly(4-methyl-1-pentene), poly(tetrafluoroethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane) bis (4-phenyl) carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethyl styrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose actate, cellulose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(l-vinylpyrrolidone-co-styrene), poly(l-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-all-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly(propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and combinations thereof. In addition, perfluoro(1-butenyl vinyl ether) homocyclopolymers (for example, those under the trade name CYTOP®) can be used. Examples of such fluorinated cyclopolymers include those having one of the following structures:

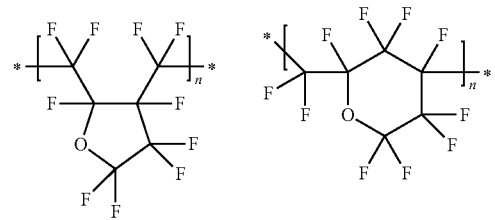

Poly[4,5-difluoro-2,2-bis(trifluoromethyl)-1,3-dioxole-co-tetrafluoroethylene (commercially available under the trade name Teflon® AF 2400) having the following structure also can be used:

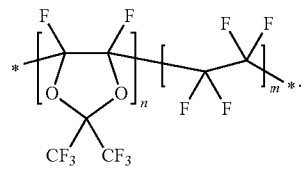

The semiconductor layer can comprise an organic semiconductor material prepared from an organic semiconducting molecule or polymer. Examples include various fused heterocycles, aromatic hydrocarbons, polythiophenes, fused (hetero)aromatics (e.g., perylene imide and naphthalene imide small molecule or polymers), and other such organic semiconductor compounds or materials, whether p-type or n-type, otherwise known or found useful in the art. For example, the semiconductor component can be prepared from one or more compounds and/or polymers as described in U.S. Pat. Nos. 6,585,914, 6,608,323, 6,991,749, 7,374702, 7,528,176, 7,569,693, and 7,605,225; U.S. Patent Publication Nos. 2005/0176970, 2006/0186401, 2007/0282094, 2008/0021220, 2008/0167435, 2008/0177073, 2008/0185555, 2008/0185577, 2008/0249309, and 2009/0036643; and International Publication Nos. WO2009/098254, WO2009/098252, WO2009/098253, WO2009/098250, WO2010/117449, and WO2011/082234, the disclosure of each of which is incorporated by reference herein. In some embodiments, the semiconductor layer can comprise an inorganic semiconductor material such as silicon, germanium, gallium arsenide, various metal oxides and metal chalcogenides known in the art, and the like. Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium tin zinc oxide (ITZO), tin oxide ($SnO_2$), and zinc oxide (ZnO). Examples of metal chalcogenide semiconductors include cadmium sulfide (CdS), cadmium selenide (CdSe), and the like. Solution-phase processed metal oxides and metal chalcogenides are described in, for example, U.S. Pat. No. 8,017,458, the entire disclosure of which is incorporated by reference herein for all purposes. Alternatively, the semiconductor layer can comprise a vapor-phase processed (e.g., sputtered) metal oxide or chalcogenide.

In some embodiments, the present polymers can be a component (e.g., as an additive) in the semiconductor layer. Specifically, both the semiconductor (SC) and the polymer (Pol) can be dissolved in a solvent in which both materials are soluble. Typical total concentrations are from about 2 mg/ml to about 20 mg/ml, preferably between about 5 mg/ml and about 15 mg/ml. The weight ratio between the semiconductor and the polymer (SC:Pol, w:w) typically can range from about 10:1 to about 1:10, preferably from about 8:2 to about 2:8, more preferably from about 6:4 to about 4:6. The formulation can be spin-coated and the corresponding semiconducting layer film can be annealed at temperatures at which the polymers of the present teachings do not crosslink. Alternatively, the Pol portion of the semiconductor layer film can be crosslinked by heating alone, by radiation alone, by heating followed by radiation, or by radiation followed by heating. For example, the semiconductor layer can be prepared from a composition comprising one of the organic semiconducting molecules or polymers listed hereinabove and at least one of the present polymers, thereby providing a blend organic semiconductor material. In particular embodiments, the semiconductor layer can be prepared from a composition comprising a small-molecule organic semiconducting compound (such as, but not limited to, any of the small-molecule OSCs listed hereinabove) and a polymer according to the present teachings as an additive.

A dielectric material according to the present teachings can be prepared by dissolving one or more polymers described herein in an organic solvent to provide a dielectric composition, depositing (e.g., by spin-coating or printing) the dielectric composition onto a substrate, and optionally performing at least one curing step (e.g., to crosslink the polymer) to form a dielectric material. For example, the curing step can involve heating at a temperature within the range of about 100° C. and about 350° C. (preferably between about 120° C. and about 250° C.) for a duration between about 2 minutes and about 60 minutes (preferably between about 5 minutes and about 30 minutes). The curing step also can involve irradiation (e.g., with ultraviolet light). In certain embodiments, one or more metal oxides can be added to the dielectric composition prior to the depositing step. In certain materials, one or more dielectric polymers can be added to the dielectric composition prior to the depositing step. In certain embodiments, one or more crosslinkers can be added to the dielectric composition prior to the depositing step. An organic semiconductor layer can be formed via a solution-phase process prior or after the formation of the dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

In some embodiments, a multi-layer dielectric material according to the present teachings can be prepared by dissolving one or more polymers described herein in an organic solvent to provide a dielectric composition, where the dielectric composition optionally can include at least one of a dielectric polymer, a metal oxide, and a crosslinker; depositing (e.g., by spin-coating or printing) the dielectric composition onto a substrate to form a first layer; and depositing a composition that includes a dielectric polymer or a metal oxide to form a second layer. After each depositing step, a curing step can be performed, e.g., by heating and optionally irradiation using parameters described herein. An organic semiconductor layer can be formed via a solution-phase process prior or after the formation of the multi-layer dielectric layer. For example, the organic semiconductor layer can be formed from a composition comprising an organic semiconducting molecule or polymer in an organic solvent that is orthogonal to the organic solvent in the dielectric composition. An inorganic semiconductor can be formed by vapor deposition such as sputtering.

Crosslinked thin film materials prepared from the present polymers also can be used as a passivation layer in a thin film transistor given their barrier properties to moisture and oxygen. When used as a passivation layer, the thin film material can have a thickness in the range of about 0.2 µm to about 6 µm. The passivation layer can be prepared by dissolving one or more polymers described herein in an organic solvent to provide a coating formulation, depositing (e.g., by spin-coating or printing) the coating formulation onto a substrate (e.g., overlying the source and drain electrodes), and optionally performing at least one curing step to form a passivation layer. The curing step can be induced by heat or radiation. For example, the curing step can involve heating at a temperature within the range of about 100° C. and about 350° C. (preferably between about 120° C. and about 250° C.) for a duration between about 2 minutes and about 60 minutes (preferably between about 5 minutes and about 30 minutes). The curing step also can involve irradiation (e.g., with ultraviolet light). By using the present crosslinked organic materials, which can provide improved moisture- and oxygen-blocking properties, as the passivation layer, the thin film transistor can achieve better device reliability. In addition, because the present polymers can be soluble in solvents that are orthogonal to those typically used to deposit organic semiconducting molecules or polymers, a passivation layer comprising the present polymers can be formed via a solution-phase process on top of the source and drain electrodes in a top-contact transistor structure without damaging the organic semiconductor channel region.

Because the present polymers can be crosslinked at relatively low temperatures (e.g., below about 160° C.) or by radiation, they are compatible with a large variety of substrates, including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be an inexpensive rigid substrate that has relatively low heat and/or chemical resistance. For example, the present organic thin films can be coupled to an inexpensive soda lime glass substrate, as opposed to more expensive and higher heat and/or chemical resistant glass substrates such as quartz and VYCOR®. In embodiments where a very high degree of crosslinking is desirable, higher crosslinking temperatures (e.g., about 350° C.) may be used, in which case, more thermally-resistant plastic substrates or flexible glasses or metals can be used. Substrate-gate materials commonly used in thin-film transistors include doped silicon wafer, tin-doped indium oxide on glass, tin-doped indium oxide on polyimide or mylar film, aluminum or other metals alone or coated on a polymer such as polyethylene terephthalate, a doped polythiophene, and the like.

Accordingly, the present teachings also relate to electronic, optical, or optoelectronic device comprising an organic layer comprising a crosslinked material prepared from at least one of the present polymers, where the organic layer can be in contact or coupled to a semiconductor layer (e.g., an organic or inorganic semiconductor layer) and/or a conductive component (e.g. a metallic contact that functions as either the source, drain, or gate electrode) either directly or via optionally present intervening layer(s) such as a protective or surface modifying interlayer. In various embodiments, the device can be a transistor device, for example an organic thin film transistor (OTFT) (more specifically, an organic field effect transistor (OFET) or an organic light-emitting transistor (OLET)) or a semiconductor oxide thin film transistor (SOTFT). The source and drain electrodes as well as the gate electrode can be made using various deposition techniques. For example, the source and drain electrodes can be deposited through a mask, or can be deposited then etched. Suitable deposition techniques include electrodeposition, vaporization, sputtering, electroplating, coating, laser ablation and offset printing, from metal or metal alloy including copper, aluminum, gold, silver, platinum, palladium, and/or nickel, or an electrically conductive polymer such as polyethylenethioxythiophene (PEDOT).

An aspect of the present teachings relates to a thin film transistor device including a dielectric layer comprising a dielectric material as described herein, a semiconductor layer, a gate electrode, a source electrode, and a drain electrode. The dielectric layer typically is disposed between the semiconductor layer and the gate electrode. Depending on the device geometry, the source and drain electrodes can be disposed above the semiconductor layer (top-contact), or the semiconductor layer can be disposed above the source and drain electrodes (bottom-contact).

Another aspect of the present teachings relates to methods for fabricating field effect transistors that include a dielectric material of the present teachings. The dielectric materials of the present teachings can be used to fabricate various types of field effect transistors including, but not limited to, top-gate top-contact structures, top-gate bottom-contact structures, bottom-gate top-contact structures, and bottom-gate bottom-contact structures.

In some embodiments, the method can include depositing a dielectric composition according to the present teachings onto a substrate (gate) to form a dielectric layer, wherein the dielectric composition includes one or more polymers described herein dissolved in a first solvent; depositing a semiconducting composition onto the dielectric layer to form a semiconductor layer, where the semiconducting composition includes one or more semiconducting compounds (e.g., small molecule compounds or polymers) dissolved in a second solvent, and where the first solvent and the second solvent are orthogonal solvents; and forming a first electrical contact and a second electrical contact (source and drain) on the semiconductor layer, thereby providing a top-contact bottom-gate organic field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more polymers described herein dissolved in a first solvent; forming a first electrical contact and a second electrical contact (source and drain) above the dielectric material; and depositing a semiconducting composition above the first and second electrical contacts and the dielectric layer (i.e., to cover the electrical contacts and an area of the dielectric material between the electrical contacts) to form a semiconductor layer, where the semiconducting composition includes one or more semiconducting compounds (e.g., small molecule compounds or polymers) dissolved in a second solvent, and where the first solvent and the second solvent are orthogonal solvents; to provide a bottom-contact bottom-gate organic field effect transistor. The method can include curing the dielectric layer, for example, by heating, by radiation, or by both heating and radiation (in either order) to induce crosslinking.

In some embodiments, the method can include forming a first electrical contact and a second electrical contact (source and drain) on a substrate; depositing a semiconducting composition above the first and second electrical contacts (i.e., to cover the electrical contacts and an area of the substrate between the electrical contacts) to form a semiconductor layer, where the semiconducting composition includes one or more semiconducting compounds (e.g., small molecule compounds or polymers) dissolved in a first solvent; depositing a dielectric composition according to the present teachings above the semiconductor layer to form a dielectric layer, where the dielectric composition includes one or more polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a bottom-contact top-gate organic field effect transistor. The method can include curing the dielectric layer, for example, by heating, by radiation, or by both heating and radiation (in either order) to induce crosslinking.

In some embodiments, the method can include depositing a semiconducting composition on a substrate to form a semiconductor layer, where the semiconducting composition includes one or more semiconducting compounds (e.g., small molecule compounds or polymers) dissolved in a first solvent; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more polymers described herein dissolved in a second solvent, and where the first solvent and the second solvent are orthogonal solvents; and forming a third electrical contact (gate) above the dielectric material, wherein the third electrical contact is above an area between the first and second electrical contacts, to provide a top-contact top-gate organic field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more polymers described herein; forming a metal oxide semiconductor layer on the dielectric layer; and forming a first electrical contact and a second electrical contact (source and drain) on the semiconductor layer, thereby providing a top-contact bottom-gate metal oxide field effect transistor. The method can include curing the dielectric layer, for example, by heating, by radiation, or by both heating and radiation (in either order) to induce crosslinking.

In some embodiments, the method can include depositing a dielectric composition according to the present teachings onto a substrate (gate) to form a dielectric layer, wherein the dielectric composition includes one or more polymers described herein; forming a first electrical contact and a second electrical contact (source and drain) above the dielectric material; and forming a metal oxide semiconductor layer above the first and second electrical contacts and the dielectric layer (i.e., to cover the electrical contacts and an area of the dielectric material between the electrical contacts), to provide a bottom-contact bottom-gate metal oxide field effect transistor. The method can include curing the dielectric layer, for example, by heating, by radiation, or by both heating and radiation (in either order) to induce crosslinking.

In some embodiments, the method can include forming a first electrical contact and a second electrical contact (source and drain) on a substrate; forming a metal oxide semiconductor layer above the first and second electrical contacts (i.e., to cover the electrical contacts and an area of the substrate between the electrical contacts); depositing a dielectric composition according to the present teachings above the semiconductor layer to form a dielectric layer, where the dielectric composition includes one or more polymers described herein; and forming a third electrical contact (gate) above the dielectric material, wherein the third electrical contact is above an area between the first and second electrical contacts, to provide a bottom-contact top-gate metal oxide field effect transistor. The method can include curing the dielectric layer, for example, by heating, by radiation, or by both heating and radiation (in either order) to induce crosslinking.

In some embodiments, the method can include forming a metal oxide semiconductor layer on a substrate; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more polymers described herein; and forming a third electrical contact (gate) above the dielectric material, wherein the third electrical contact is above an area between the first and second electrical contacts, to provide a top-contact top-gate metal oxide field effect transistor. The method can include curing the dielectric layer, for example, by heating, by radiation, or by both heating and radiation (in either order) to induce crosslinking.

The semiconductor layer and the various electrical contacts can be formed by various deposition processes known to those skilled in the art. For example, the semiconductor layer can be formed by processes such as, but not limited to, sputtering, ion-assisted deposition (IAD), physical vapor deposition, different types of printing techniques (e.g., flexo printing, litho printing, gravure printing, ink-jetting, pad printing, and so forth), drop casting, dip coating, doctor blading, roll coating, and spin-coating. In preferred embodiments, the semiconductor layer is formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

Yet another aspect of the present teachings relates to methods for fabricating field effect transistors that include a surface-modifying layer of the present teachings. For example, the method can include depositing a surface modifier composition onto a substrate (e.g., glass), wherein the surface modifier composition includes one or more polymers described herein, prior to formation of the source and drain contacts, formation of the semiconductor layer, formation of the gate dielectric layer, and formation of the gate contact (regardless of sequence of these steps as required by the desired configuration). The method can include curing the surface-modifying layer, for example, by heating, by radiation, or by both heating and radiation (in either order) to induce crosslinking.

A further aspect of the present teachings relates to methods for fabricating field effect transistors that include an encapsulation layer of the present teachings. For example, subsequent to the formation of the TFT stack, the method can include depositing a composition including one or more polymers of the present teachings over the entire TFT stack to form an encapsulation layer, and optionally curing the encapsulation layer by heating, by radiation, or by both heating and radiation (in either order) to induce crosslinking.

EXAMPLES

The following examples are provided to illustrate further and to facilitate the understanding of the present teachings and are not in any way intended to limit the scope of the disclosure.

Example 1: Synthesis of Cyclopropane-Containing Polymer C50

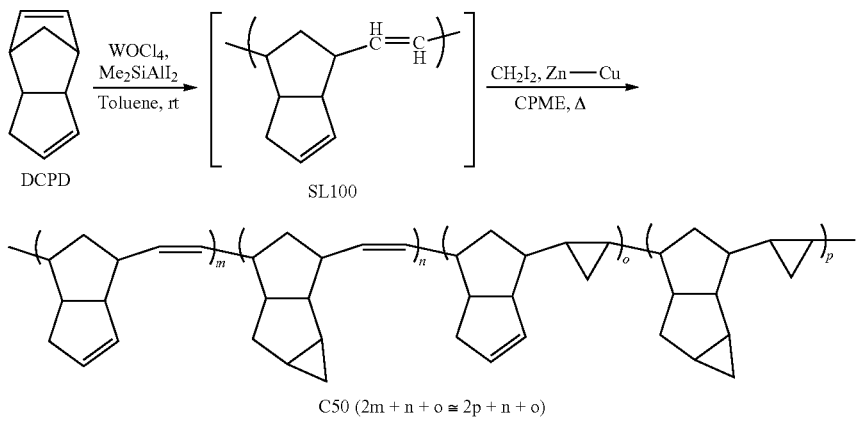

C50 (2m + n + o ≅ 2p + n + o)

About 240 g dicyclopentadiene (DCPD) was mixed with 4 g CaH$_2$ under nitrogen and stirred at 110° C. for 24 h. The mixture was distilled at 110° C. under 120 torr with the bath temperature at 150° C. The purified DCPD was then stored under nitrogen at rt as the starting material for the following synthesis.

To a 100 ml round bottom flask under nitrogen were added the above purified dicyclopentadiene (5.5 g, 41.5 mmol), anhydrous toluene (50 mL) and diallyldimethylsilane (0.06 mL, 0.34 mmol). Then the mixture was cooled by ice-water bath for 5 min. WOCl$_4$ (58 mg, 0.17 mmol) was added under nitrogen. The ice-water bath was removed after another 5 min and the mixture vigorously stirred overnight (18-24 h) at rt. Then cyclopentyl methyl ether (15 mL) was added and the mixture stirred for another 1.5 hours. After addition of Irganox 1076 (22 mg), the mixture was filtered through 10 um filter paper under 80 psi air, concentrated by rotovap (40-45° C., 26-29 torr) to give a semi-solid gel and further dried under high vacuum to give a crude SL100 which was used directly for the next step without further purification.

Zn—Cu couple (6.5 g, 0.10 mol) was stirred in anhydrous cyclopentyl methyl ether (12 ml) under nitrogen. Iodine (710 mg, 2.80 mmol) was added and stirred until the color faded (~7 min). Then a solution of the crude SL100 and diiodomethane (22.27 g, 83 mmol) in cyclopentyl methyl ether (50 mL) was added by cannula transfer. After the addition, the flask was placed into a preheated bath at 50° C. and stirred at 600 rpm overnight (18-24 hours). After cooling down by ice-water bath under vigorous stirring, a mixture of pyridine (24 ml) and cyclopentyl methyl ether (62 ml) was dropwise added for 15 min. Then the mixture was allowed back to room temperature, filtered through 10 um filter paper under 90 psi air and then precipitated into methanol (250 mL). The solid was collected by filtration through a 10 um filter paper under 90 psi air and dried under high vacuum overnight. This crude product was then redissolved by toluene (60 ml), filtered through a stack of 10 um and 0.2 um filter papers under 90 psi air, precipitated into methanol (200 ml), filtered through 10 um filter paper under 90 psi air, collected and dried under high vacuum for 30 hours. Finally, the pure product C50 was obtained as a white powder (4.7 g, yield 77%). $^1$H NMR (CDCl$_3$, 500 MHz): δ=5.86-5.07 (br m, 2H), 3.39-1.95 (br m, 3H), 1.94-0.02 (br m, 8H), −0.04- 0.49 (br m, 1H). Based on NMR, the degree of the cyclopropanation of the double bonds is ~50%.

The Zn—Cu couple used in the above reaction could be replaced by other organometallic compounds such as trimethylaluminum and diethylzinc and zinc species activated by other reagents/methods such as trimethylsilyl chloride, copper, copper(I) chloride, silver, titanium(IV) chloride, acetyl chloride, dimethyl acetamide and ultrasound.

The solvent used in the above reaction could also be replaced by other aprotic solvents such as dichloromethane and toluene.

With the variation of the reaction conditions and reagent ratios, the degree of the cyclopropanation of the double bonds could be varied from 10% to 90%, preferably from 30% to 70%, and more preferably from 45% to 55%.

Example 2: Synthesis of Cyclobutane-Containing Polymers

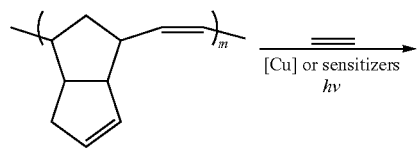

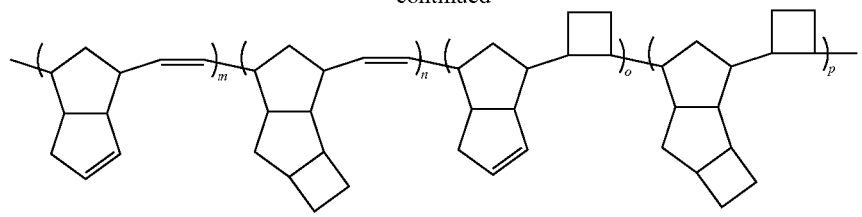

It is reported in Synthesis, 2007, 1247-1250 that copper (I)-catalyzed photocycloaddition of alkenes proceeds through ground-state formation of a 2:1 alkene-copper(I) complex, which shows UV absorption at 230-240 nm. Thus, this complex can be photoexcited when irradiated leading to cycloaddition to afford cyclobutanes. Furthermore, Intermolecular [2+2] photocycloaddition in [tmba][NTf2] was found to proceed in an even better yield than in conventional organic solvents. Both dicyclopentadiene and norbornene produced the [2+2] dimers in good yields.

Example 3: Synthesis of Cyclopentane Containing Polymers

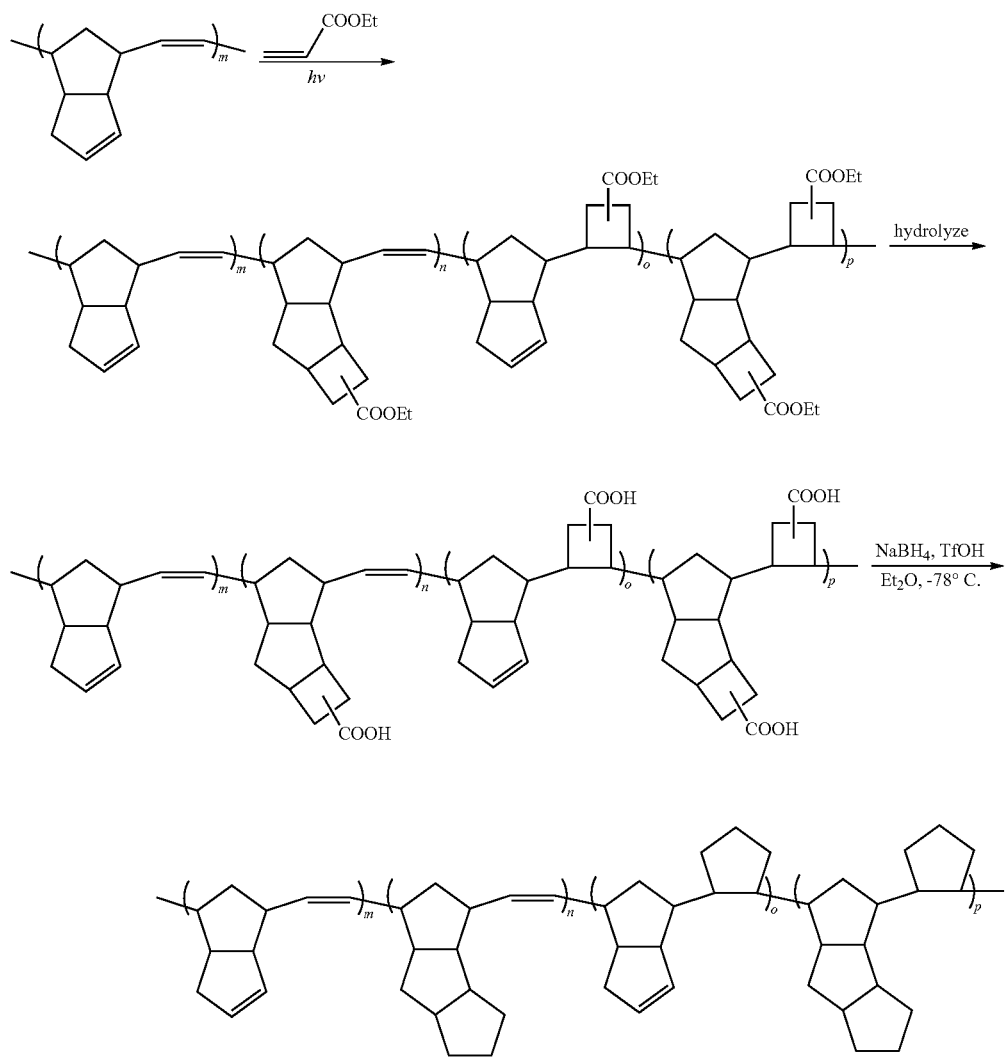

In Journal of the Organic Chemistry, 1989, 54, 1452-1453, it was reported that cyclic hydrocarbons including the cyclobutane could expand through single step one carbon ring homologation via their methyl alcohol or carboxylic acids with sodium borohydride and triflic acid. So the polydicyclopentadiene could react with ethyl acrylate through photoinduced [2+2] cycloaddition, followed by hydrolysis and then homologation to give the cyclopentane derivatives.

Example 4: Synthesis of Cyclohexane Containing Polymers

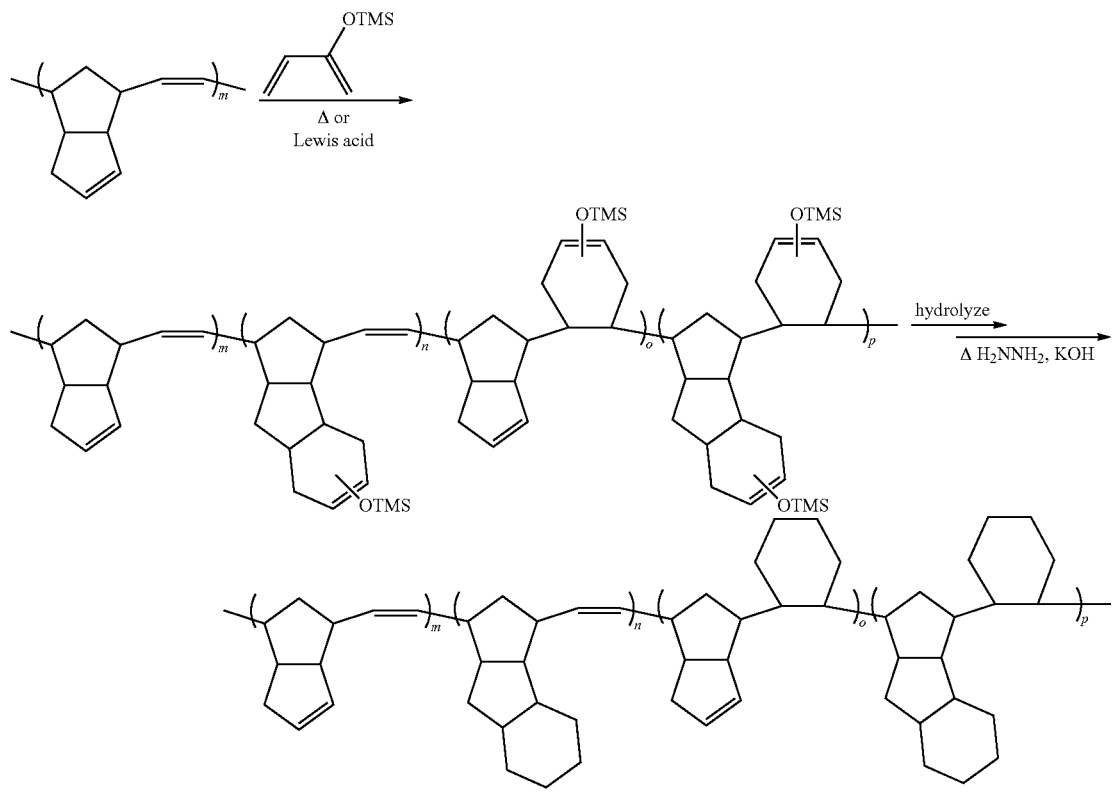

The polydicyclopentadiene could react with siloxy dienes, as described in Accounts of Chemical Research, 1981, 14, 400-406, to go through Diels-Alder cyclization, followed by hydrolysis and Wolff-Kishner reduction to afford the cyclohexane derivatives.

Example 5: Crosslinking of C50

A 117 nm thin film of C50 spin-coated on a Si/silicon dioxide substrate from a polymer solution was baked in a nitrogen-filled glove box at up to 300° C. for 0.5 h. After cooling down, the film was transferred out and could be completely dissolved by dichloromethane. NMR showed no difference between before and after thermal treatment in the nitrogen glove box, suggesting a lack of crosslinking.

Figure 3:
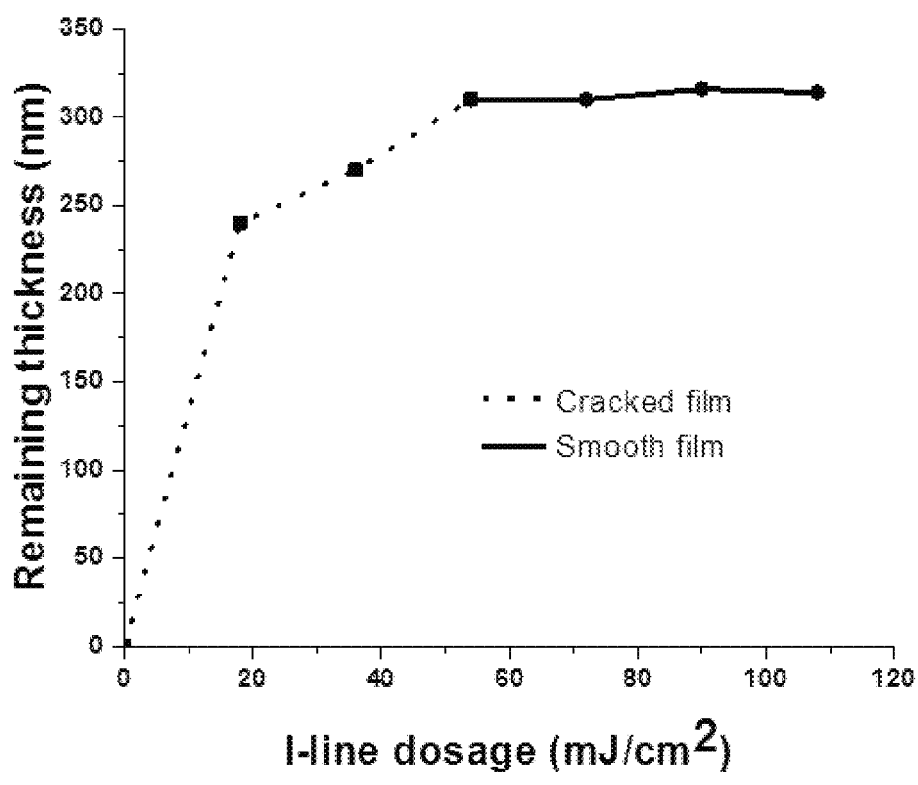
FIG. 3 shows a contrast curve for I-line exposed C50 films.

UV crosslinking of C50 at selected wavelengths (I-line). Thin films of C50 with different type of photo initiators and/or sensitizers can be UV cured at different wavelengths. For example, a solution of C50 (14.6 mg), 1-[4-(Phenylthio) phenyl]-1,2-octanedione 2-(O-benzoyloxime) (Irgacure OXE-01, 0.73 mg), Polydimethylsiloxane (0.1 wt % to C50) in 1 ml methylcyclohexane was spin-coated onto silicon substrates at 1000 rpm for 60 seconds. The resulting films were then exposed to UV light passing through a UV filter at 370 nm for different dosages at a light density of about 15 mW/cm$^2$. After exposure, the films were developed into methylcyclohexane for 20 seconds, followed by inspection of the film quality by eyes. The results are reported in Table 1 below. The corresponding contrast curve is reported in FIG. 3.

TABLE 1

| UV Curing Dosage (mJ/cm$^2$) | Chemical Resistance |
| --- | --- |
| 18 | Poor |
| 36 | Poor |
| 54 | Good |
| 72 | Excellent |
| 90 | Excellent |
| 108 | Excellent |

Figure 4:
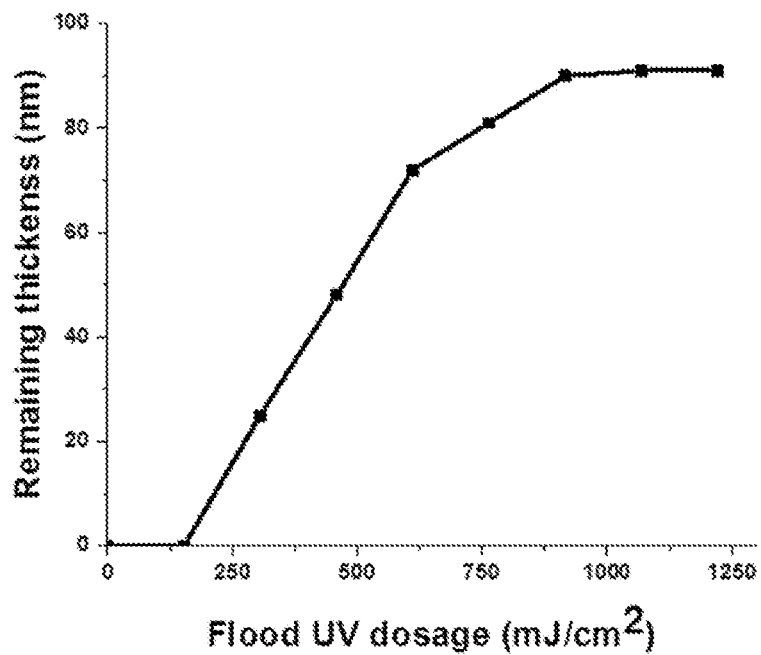
FIG. 4 shows a contrast curve for flood UV exposed C50 films.

Flood UV crosslinking of C50. A solution of C50 in MCH (10 mg/ml) was spin-coated on a Si substrate at 700 rpm for 60 s to give a film ~100 nm thick, which was exposed under flood UV with various dosages and developed with MCH. The thickness of the remaining film after development was accessed by profilometry, which indicates that a dose of ~900 mJ/cm2 affords a robust film. The corresponding contrast curve is shown in FIG. 4.

Thermal crosslinking of C50. A batch of 90 nm thick films of C50 spin-coated on silicon substrates from a polymer solution were baked in the air at different temperatures and for different annealing times (see Table 2). After cooling the substrates at room temperature, they were immersed in methylcyclohexane for 5 minutes to access chemical resistance and film quality. Film thickness was determined by profilometry. The results are collected in Table 2 below. Control experiment. A 90 nm thick film of C50 on a silicon substrate was baked in a nitrogen-filled glove box at 300° C. for 0.5 h. After cooling to room temperature, the film immersed in dichloromethane was completely dissolved, suggesting negligible crosslinking.

TABLE 2

| Curing Temperature | Time | Chemical Resistance |
|---|---|---|
| 120° C. | 0.5 h | Gone |
|  | 1 h | Gone |
|  | 2.5 h | Fair |
|  | 4 h | Excellent |
|  | 8 h | Excellent |
|  | 24 h | Excellent |
| 130° C. | 1 h | Excellent |
|  | 1.5 h | Excellent |
|  | 15 h | Excellent |
| 140° C. | 0.5 h | Gone |
|  | 1 h | Gone |
| 150° C. | 0.5 h | Gone |
|  | 1 h | Fair |

Example 6: Dielectric Characterization of C50 Films

Metal-insulator-semiconductor (MIS) capacitor structures are fabricated using dielectric films prepared from crosslinked C50, either by thermal baking or by flood UV irradiation, and the capacitance of the dielectric films is measured. For MIS structure fabrication, heavily doped silicon substrates are first cleaned in consecutive ultrasonic baths of acetone, soapy water, acetone and IPA for 10 minutes each. A solution of C50 (100 mg/ml in bicyclohexyl) is spin coated onto the substrates and baked at 120° C. for 5 minutes to evaporate the solvent. The films are then either annealed at 130° C. or irradiated by flood UV for different times. To complete the devices, a square-shaped Ag top electrode (100 nm thick) is thermally evaporated. The fabricated devices have an area of about 4 mm². The dielectric constant values (k) of crosslinked C50 films processed under different conditions are calculated from the measured capacitance value (C) of the MIS-type capacitor following the equation: $k = Ct/e_0 A$, were t is the thickness dielectric layer, $e_0$ is vacuum permittivity, and A is the area of the capacitor.

Figure 5:
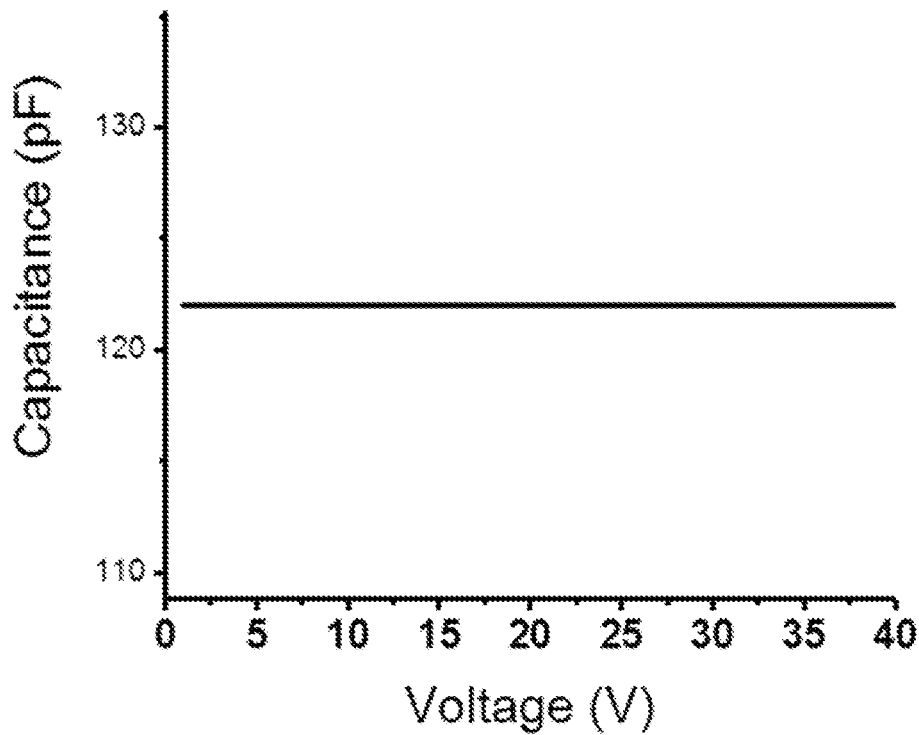
FIG. 5 shows a representative C-V curve for a UV exposed C50 film.
Figure 6A:
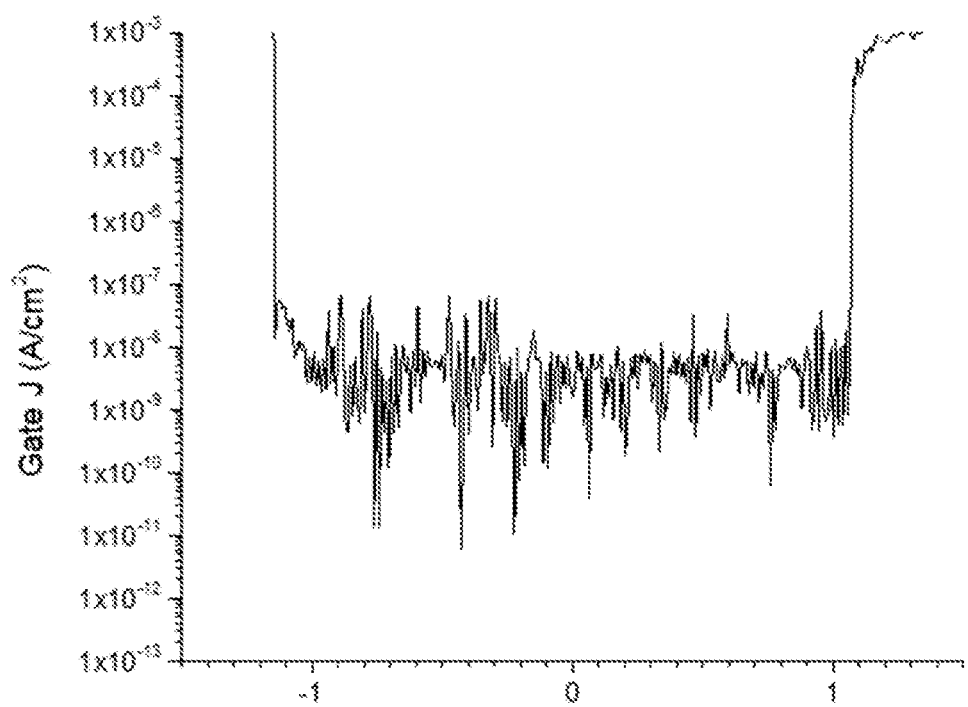
FIG. 6 shows leakage current density versus electric field for 50 films cured according to the following conditions: a) 130 C for 3 h; b) 130 C for 17 h; c) Flood UV 1 J; d) Flood UV 2 J.
Figure 6B:
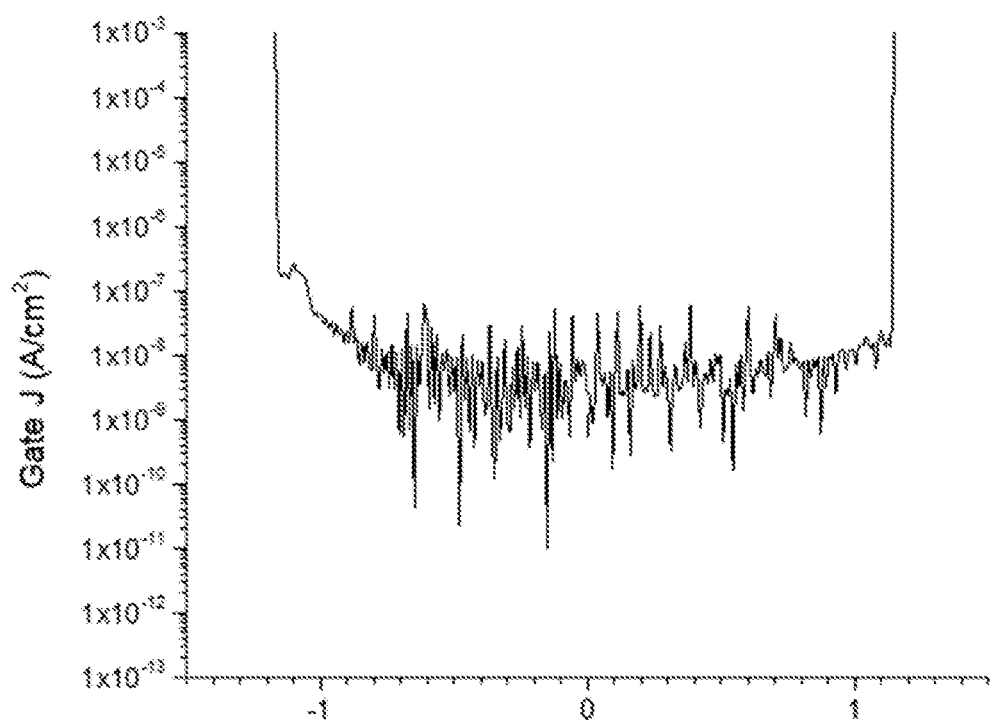
Figure 6C:
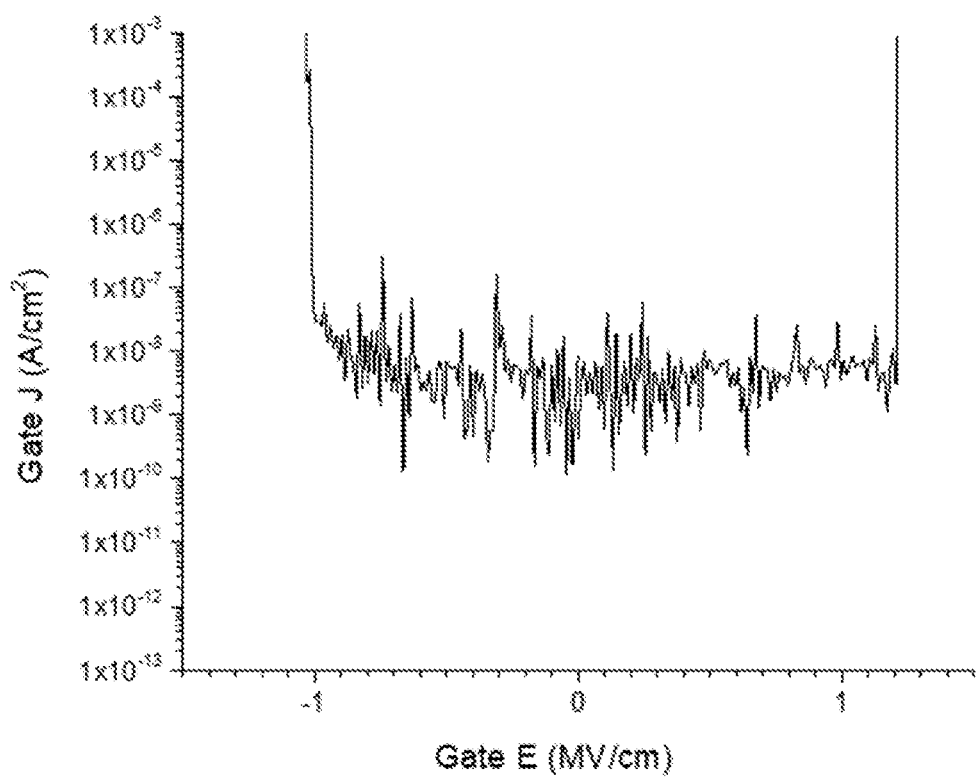
Figure 6D:
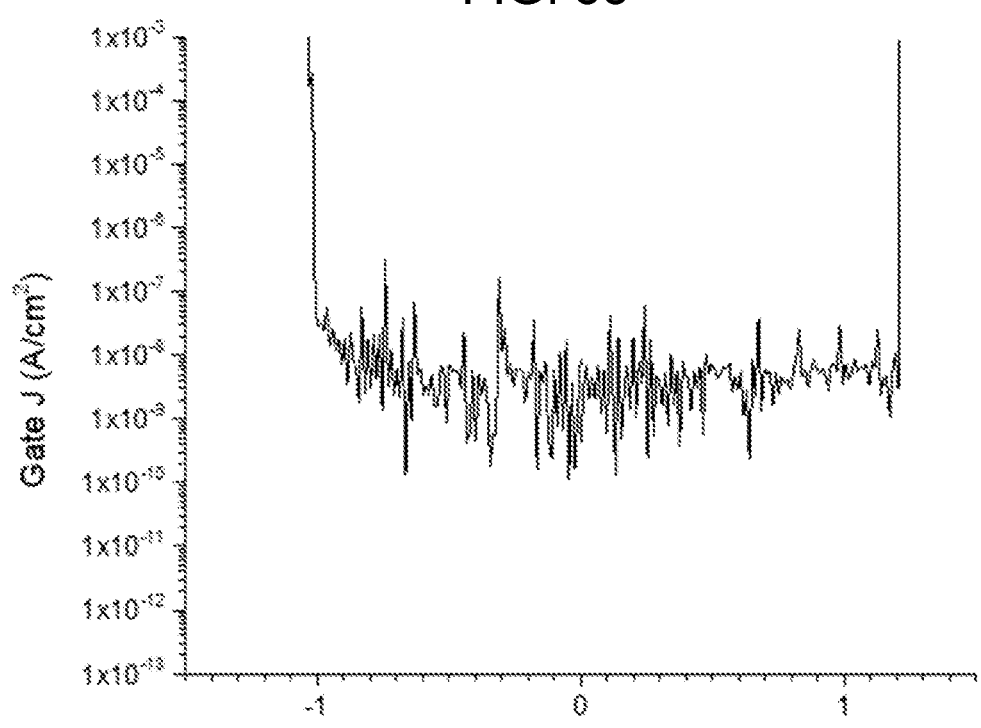

A representative C-V curve shown in FIG. 5, indicating stable response. Representative leakage current measurements (J-V curves) are provided in FIG. 6, indicating low leakage.

Example 7: OTFT Devices Including C50 as a Surface Modifier Layer (Layer 8 of FIG. 2)

Top-gate bottom-contact OTFTs were fabricated on glass. Substrates were cleaned with acetone and -propanol in an ultrasonic bath for 15 minutes each. The C50 was dissolved in bicyclohexyl to give a 100 mg/ml solution, which was spin-coated onto the glass substrates at 1000 rpm for 90 s. After film deposition, the C50 layer was baked at 130° C. overnight (~15 hours). A 100 nm silver layer was thermally evaporated through a shadow mask to form source and drain electrodes. The fabricated devices have a channel length and width of 60 um and 1000 um, respectively. Prior to OSC deposition, a sulfide derivative (5% wt in anisole) was grafted on the electrodes for 5 minutes to modify the silver work function. A PDICN2-based semiconductor layer (80 nm) was deposited by spin-coating. The OSC layer was annealed for 5 minutes at 120° C. to remove the residual solvent. The dielectric was deposited by spin-coating polymer formulations, cured by flood UV (~1 J) and baked for 10 minutes at 120° C. The device was completed by thermal evaporation of a 100 nm thick Ag gate electrode.

Figure 7:
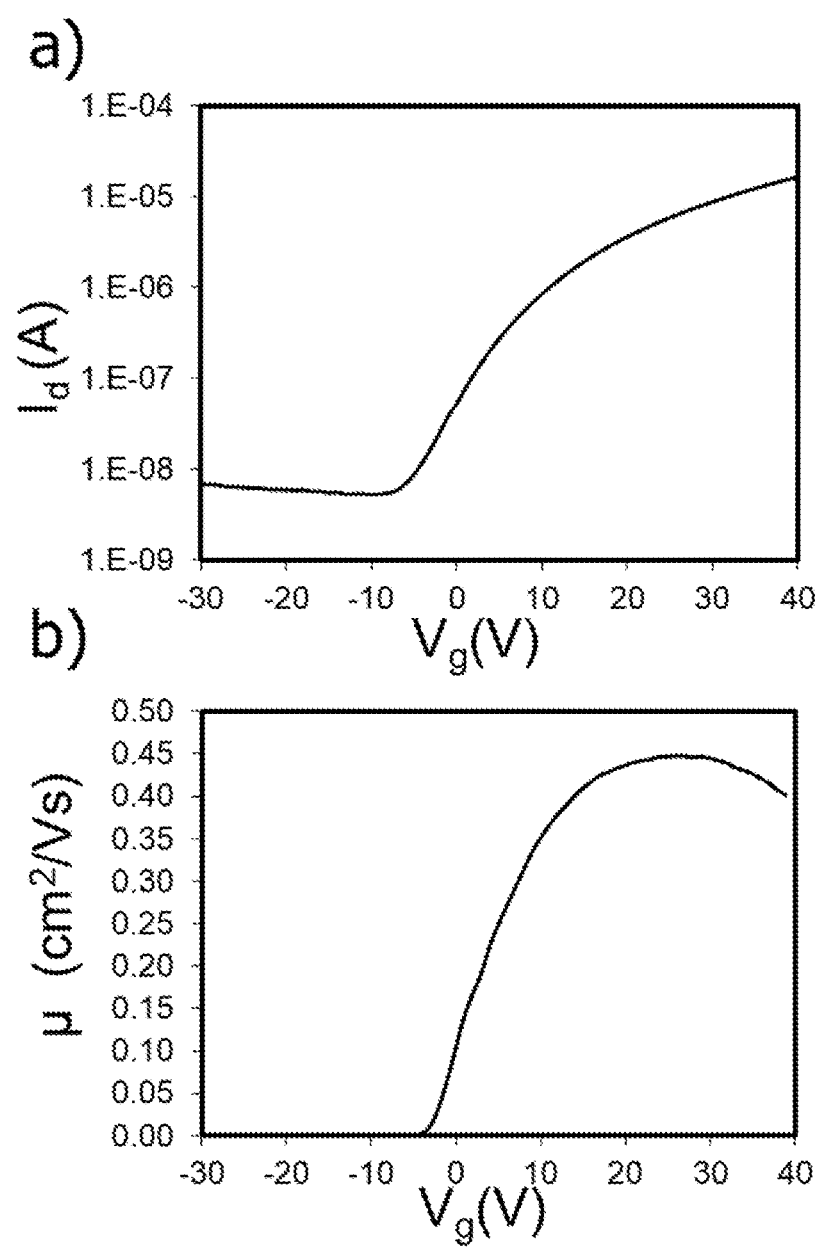
FIG. 7 shows representative transfer (a) and mobility evolution (b) plots for a polymer of the present teaching used as a surface modifier layer (Layer 8 of FIG. 2).

Typical transfer characteristics of a representative device are shown in FIG. 7. The mobility was determined to be about 0.43 cm²/Vs.

Example 8: OTFT Devices Including C50 as a Protection Layer (Layer 9 of FIG. 2)

Top-gate bottom-contact OTFTs were fabricated on polyethylene naphthalate (PEN) substrates. Substrates were cleaned with soap, DI water, acetone and 2-propanol in an ultrasonic bath for 10 minutes each. A polymeric buffer layer (600 nm) was spin-coated onto the substrates, baked at 120° C. for 10 minutes and crosslinked by flood UV irradiation (690 mJ). A 100 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 15 μm and 1000 μm, respectively. Prior to OSC deposition, a sulfide derivative (2.5% wt in anisole) was grafted on the electrodes to modify the silver work function. A PDICN2-based semiconductor layer (20 nm) was deposited by spin-coating. The OSC layer was annealed for 1 minute at 100° C. and 5 minutes at 120° C. to remove solvent residues. A 60 nm thick C50 layer was deposited onto the OSC by spin-coating and baking to serve as a first dielectric layer. A photosensitive polymeric layer (300 nm) was then spin-coated on top of C50, baked at 100° C. for 2 minutes and crosslinked by GH-line UV (300 mJ). Another photosensitive polymeric layer (500 nm) was spin-coated on the devices and crosslinked under GH-line (200 mJ) and then developed by PGMEA twice, followed by a 120° C. bake for 10 minutes to remove solvent residue. Devices were completed by thermally evaporating a 100-nm thick silver gate electrode through shadow masks under high vacuum (<6×10⁻⁶ Torr).

Figure 8:
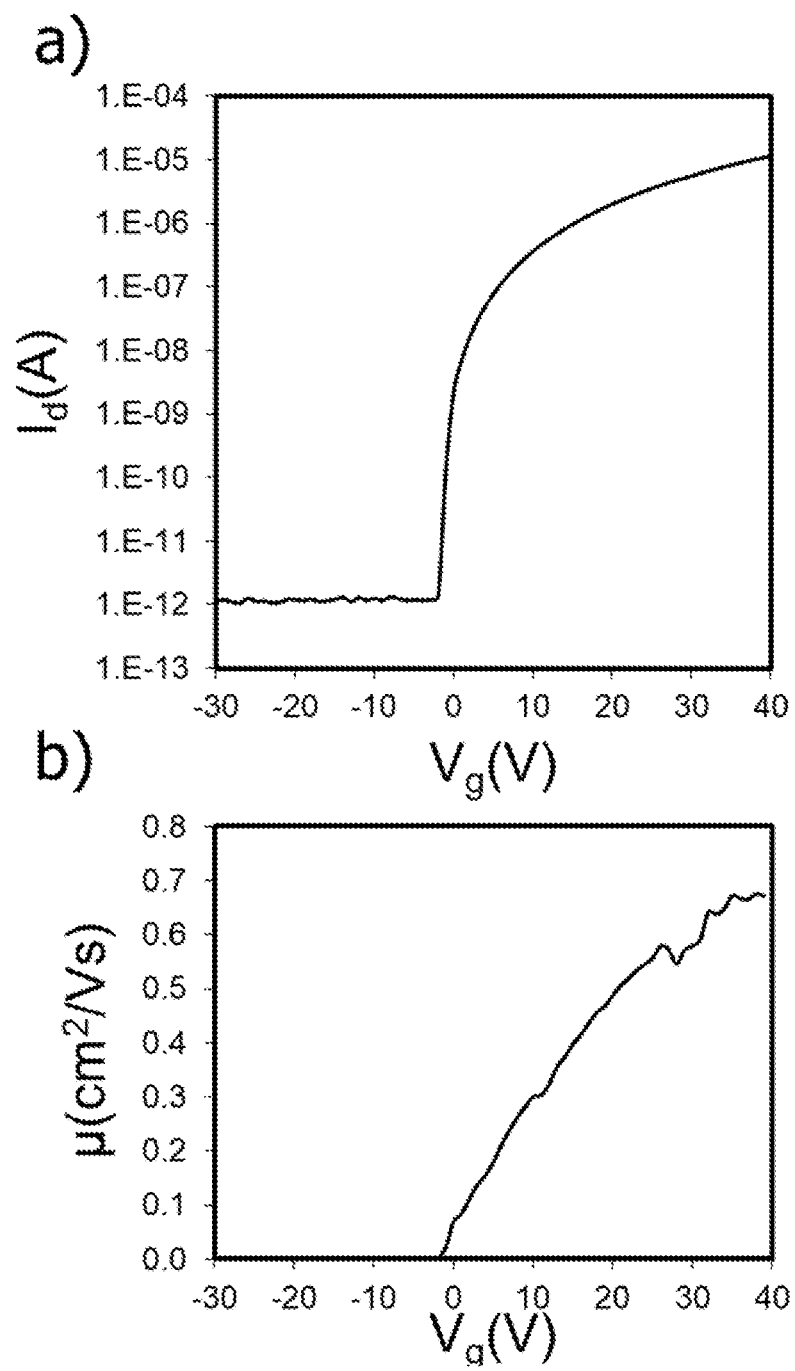
FIG. 8 shows representative transfer (a) and mobility evolution (b) plots for a polymer of the present teaching used as a protection layer (Layer 9 of FIG. 2).

Devices were measured in ambient atmosphere using a Keithley 4200 parameter analyzer. Typical transfer characteristics for the above-described devices are given in FIG. 8, with typical mobilities of ~0.4 cm²/Vs.

Example 9: OTFT Devices Including C50 as Photoresist Layer (Layer 10 of FIG. 2)

Figure 9:
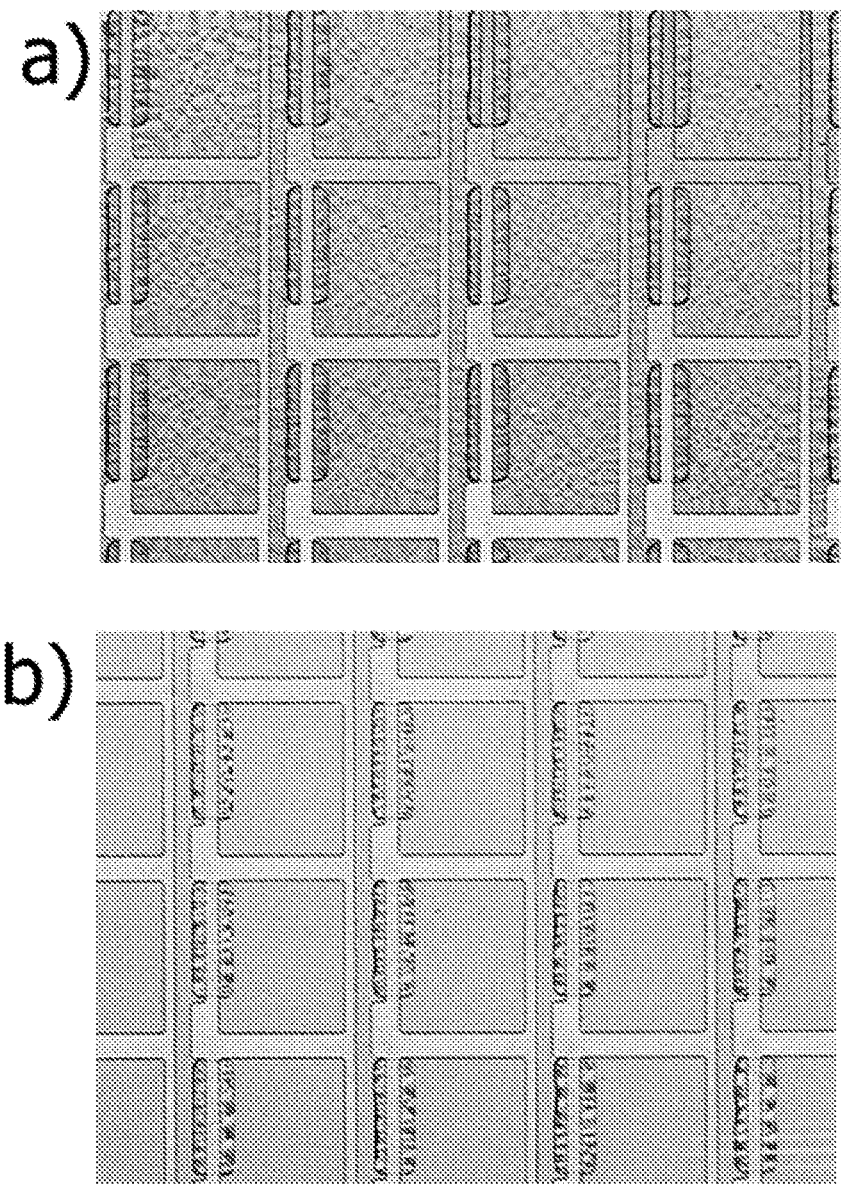
FIG. 9 shows optical image of a patterned (island) C50 film, acting as a photoresist layer, coating the (unpatterned) semiconductor layer (a) before RIE and (b) after RIE (b).

Top-gate bottom-contact OTFTs were fabricated on polyethylene naphthalate (PEN) substrates. Substrates were cleaned with soap, DI water, acetone and 2-propanol in an ultrasonic bath for 10 minutes each. A polymeric buffer layer (600 nm) was spin-coated onto the substrates, baked at 120° C. for 10 minutes and crosslinked by flood UV irradiation (690 mJ). A 100 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 15 μm and 1000 μm, respectively. Prior to OSC deposition, a sulfide derivative (2.5% wt in anisole) was grafted on the electrodes to modify the silver work function. A PDICN2-based semiconductor layer (20 nm) was deposited by spin-coating. The OSC layer was annealed for 1 minute at 100° C. and 5 minutes at 120° C. to remove solvent residues. Then a solution of C50 (30 mg), 1-[4-(Phenylthio)phenyl]-1,2-octanedione 2-(O-benzoyloxime) (Irgacure OXE-01, 1.5 mg), polydimethylsiloxane (0.1 wt % to C50) in 1 ml methylcyclohexane was spin-coated at 700 rpm to give 290 nm thick C50 layer which was then exposed to 370 nm UV for 170 mJ/cm$^2$ under the channel definition mask. After development with a cyclohexane solvent and baking, argon based reactive ion etching was performed (20 sccm, 50 W, 120 s, 3e-2 torr) to remove the semiconductor residue outside of the channel. FIG. 9 shows optical images of the semiconductor coated with the photoresist before and after RIE. A photosensitive polymeric layer (500 nm) was spin-coated on the devices and crosslinked under GH-line (200 mJ) and then developed by PGMEA twice, followed by a 120° C. bake for 10 minutes to remove solvent residue. Devices were completed by thermally evaporating a 100-nm thick silver gate electrode through shadow masks under high vacuum (<6×10$^{-6}$ Torr).

Figure 10:
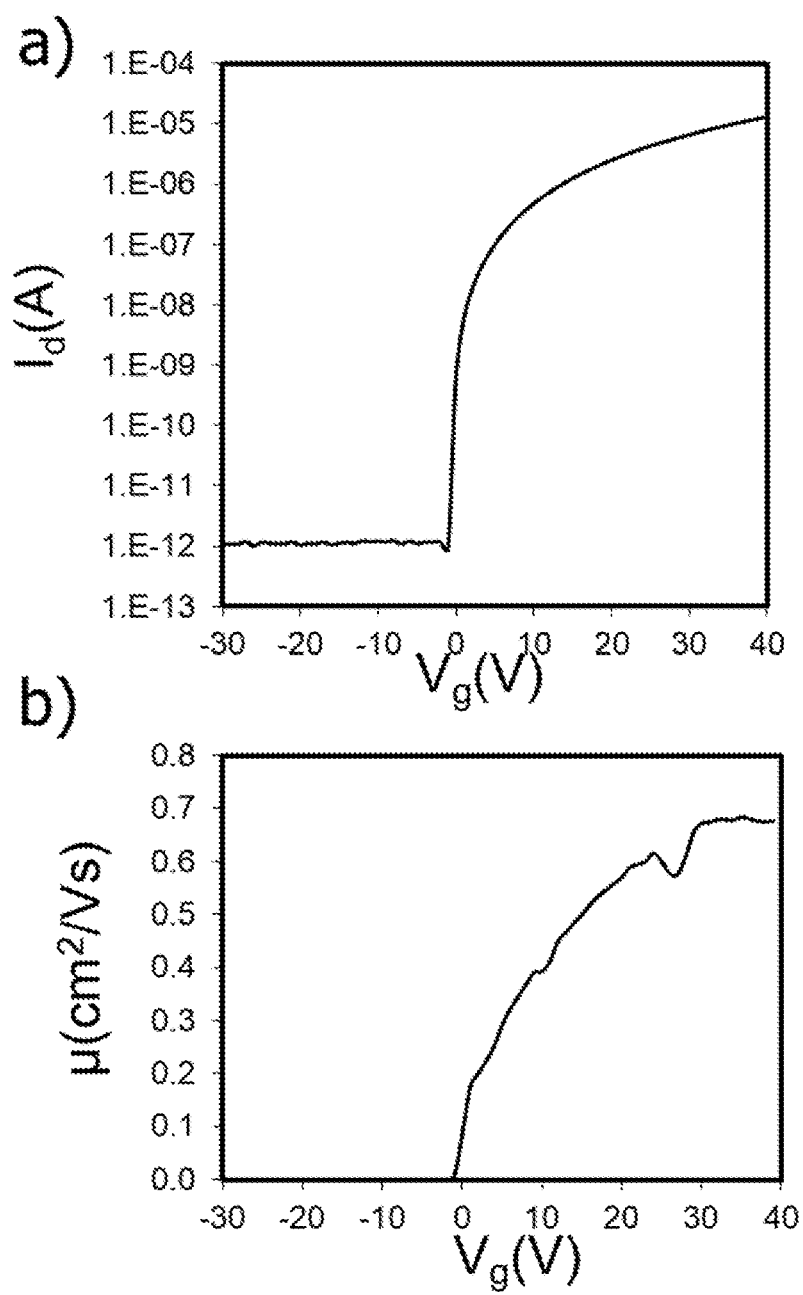
FIG. 10 shows representative transfer (a) and mobility evolution (b) plots for a polymer of the present teaching used as a photoresist layer (Layer 10 of FIG. 2).

Devices were measured in ambient atmosphere using a Keithley 4200 parameter analyzer. Typical transfer characteristics for the above-described devices are given in FIG. 10, with typical mobilities of ~0.24 cm$^2$/Vs.

Example 10: OTFT Devices Including C50 as the Dielectric Layer (Layer 11 of FIG. 2)

Top-gate bottom-contact OTFTs were fabricated on polyethylene naphthalate (PEN) substrates. Substrates were cleaned with soap, DI water, acetone and 2-propanol in an ultrasonic bath for 10 minutes each. A polymeric buffer layer (600 nm) was spin-coated onto the substrates, baked at 120° C. for 10 minutes and crosslinked by flood UV irradiation (690 mJ). A 100 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 15 μm and 1000 μm, respectively. Prior to OSC deposition, a sulfide derivative (2.5% wt in anisole) was grafted on the electrodes to modify the silver work function. A PDICN2-based semiconductor layer (20 nm) was deposited by spin-coating. The OSC layer was annealed for 1 minute at 100° C. and 5 minutes at 120° C. to remove solvent residues. Then a solution of C50 (30 mg), 1-[4-(Phenylthio)phenyl]-1,2-octanedione 2-(O-benzoyloxime) (Irgacure OXE-01, 1.5 mg), polydimethylsiloxane (0.1 wt % to C50) in 1 ml methylcyclohexane was spin-coated at 700 rpm to give 290 nm thick C50 layer which was then exposed to 370 nm UV for 200 mJ/cm$^2$ under the channel definition mask. After development with a cyclohexane solvent and baking, argon based reactive ion etching was performed (20 sccm, 50 W, 120 s, 3e-2 torr) to remove the semiconductor residue outside of the channel. The same C50 formulation was spin coated and cured for additional times to adjust the overall C50 thickness to be 660 nm. Devices were completed by thermally evaporating a 100-nm thick silver gate electrode through shadow masks under high vacuum (<6×10$^{-6}$ Torr).

Figure 11:
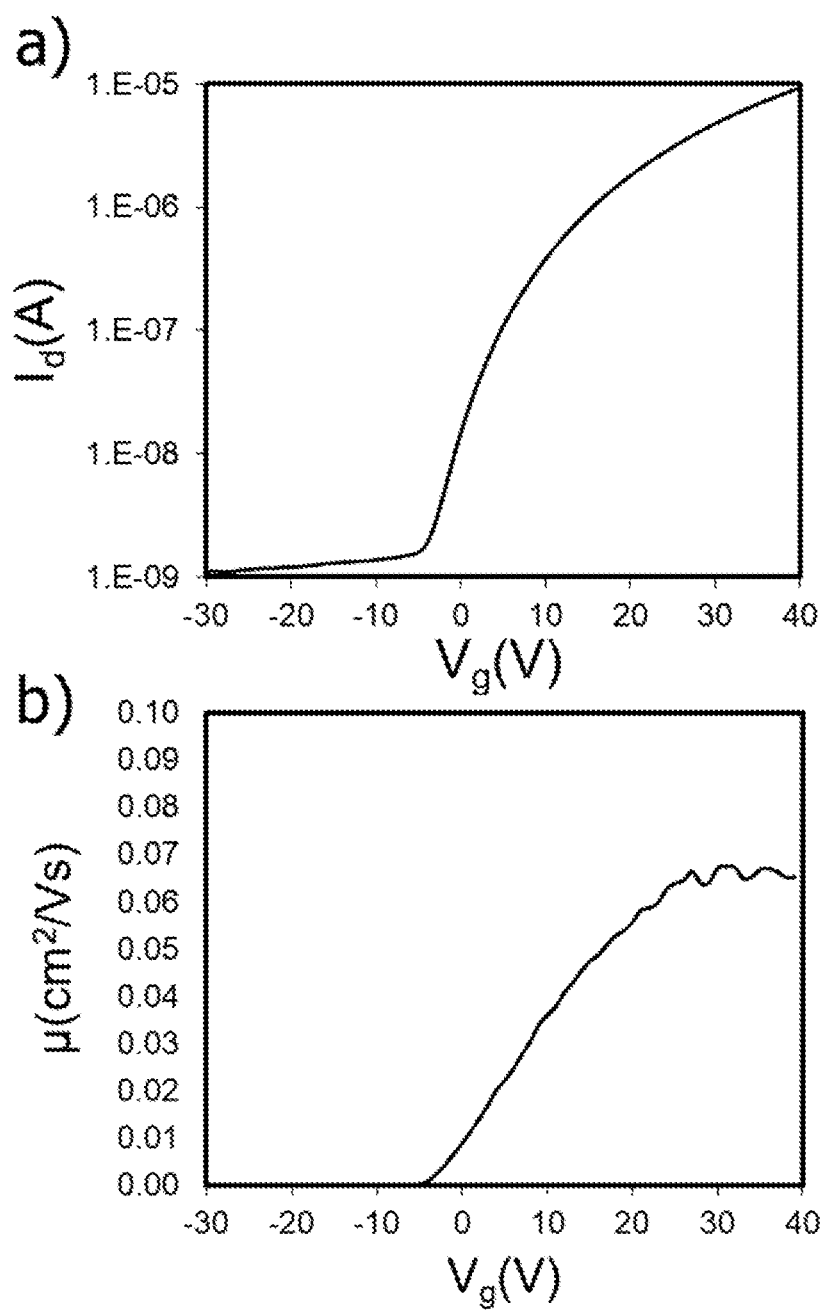
FIG. 11 shows representative transfer (a) and mobility evolution (b) plots for a polymer of the present teaching used as a dielectric layer (Layer 11 of FIG. 2).

Devices were measured in ambient atmosphere using a Keithley 4200 parameter analyzer. Typical transfer characteristics for the above-described devices are given in FIG. 11, with typical mobilities of ~0.09 cm$^2$/Vs.

Example 11: OTFT Devices Including C50 as the Passivation Layer (Layer 12 of FIG. 2)

Top-gate bottom-contact OTFTs were fabricated on polyethylene naphthalate (PEN) substrates. Substrates were cleaned with soap, DI water, acetone and 2-propanol in an ultrasonic bath for 10 minutes each. A polymeric buffer layer (600 nm) was spin-coated onto the substrates, baked at 120° C. for 10 minutes and crosslinked by flood UV irradiation (690 mJ). A 100 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 15 μm and 1000 μm, respectively. Prior to OSC deposition, a sulfide derivative (2.5% wt in anisole) was grafted on the electrodes to modify the silver work function. A PDICN2-based semiconductor layer (20 nm) was deposited by spin-coating. The OSC layer was annealed for 1 minute at 100° C. and 5 minutes at 120° C. to remove solvent residues. A 60 nm thick polymeric interfacial layer was deposited onto the OSC by spin-coating, followed by baking at 120° C. for 5 minutes. A photosensitive polymeric layer (300 nm) was then spin-coated on top of the interfacial layer, baked at 100° C. for 2 minutes and crosslinked by GH-line UV (300 mJ) through a chrome photomask. Island patterns were formed over channel regions by dissolving the un-crosslinked area with PGMEA. Devices underwent oxygen RIE followed by argon RIE to remove the exposed polymeric interfacial and OSC layers. Another photosensitive polymeric layer (500 nm) was spin-coated on the devices, crosslinked under GH-line (200 mJ), and developed by PGMEA twice, followed by a 120° C. bake for 10 minutes to remove solvent residue. A 100-nm thick silver gate electrode was thermally evaporated through shadow masks under high vacuum (<6×10$^{-6}$ Torr). Devices were completed by spin-coating C501 (300 nm) which was baked at 120° C. for 2 minutes and crosslinked under I-line UV (200 mJ). A total of four C501 layers formed an encapsulation layer of thickness of ~1200 nm. Devices were measured in ambient atmosphere using a Keithley 4200 parameter analyzer. Devices were completed by thermally evaporating a 100-nm thick silver gate electrode through shadow masks under high vacuum (<6×10$^{-6}$ Torr).

Figure 12:
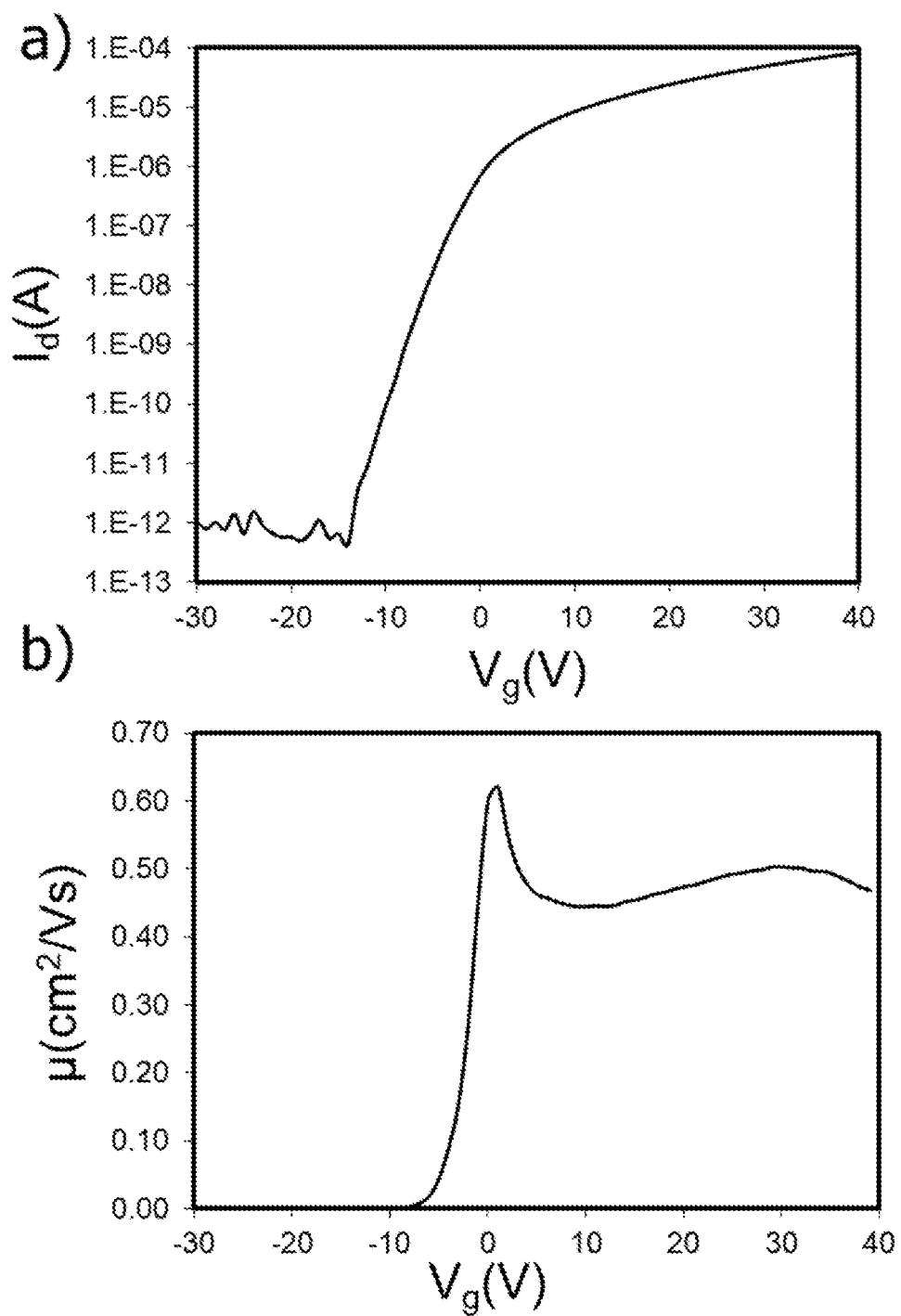
FIG. 12 shows representative transfer (a) and mobility evolution (b) plots for a polymer of the present teaching used as a passivation layer (Layer 12 of FIG. 2).

Devices were measured in ambient atmosphere using a Keithley 4200 parameter analyzer. Typical transfer characteristics for the above-described devices are given in FIG. 12, with typical mobilities of ~0.35 cm$^2$/Vs.

Example 12: P-Channel OTFT Devices Including C50 as the Photoresist Layer

Top-gate bottom-contact OTFTs were fabricated on polyethylene naphthalate (PEN) substrates. Substrates were cleaned with soap, DI water, acetone and 2-propanol in an ultrasonic bath for 10 minutes each. A polymeric buffer layer (600 nm) was spin-coated onto the substrates, baked at 120° C. for 10 minutes and crosslinked by flood UV irradiation (690 mJ). A 100 nm thermally evaporated Ag layer was patterned by classical photolithography and wet-etching processes to create source and drain electrodes (a mixture of nitric, phosphoric, and acetic acids was used as the silver etchant). The fabricated devices have a channel length and width of 400 μm and 1000 μm, respectively. Prior to OSC deposition, a sulfide derivative (2.5% wt in anisole) was grafted on the electrodes to modify the silver work function. A p-type semiconductor polymer layer was deposited by spin-coating. The OSC layer was annealed for 5 minutes at 120° C. to remove solvent residues. Then a solution of C50 (30 mg), 1-[4-(Phenylthio)phenyl]-1,2-octanedione 2-(O-benzoyloxime) (Irgacure OXE-01, 1.5 mg), polydimethylsiloxane (0.1 wt % to C50) in 1 ml methylcyclohexane was spin-coated at 700 rpm to give 290 nm thick C50 layer which was then exposed to 370 nm UV for 170 mJ/cm$^2$ under the channel definition mask. After development with a cyclohexane solvent and baking, argon based reactive ion etching was performed (20 sccm, 50 W, 120 s, 3e-2 torr) to remove the semiconductor residue outside of the channel. A photosensitive polymeric layer (500 nm) was spin-coated on the devices and crosslinked under GH-line (200 mJ) and then developed by PGMEA twice, followed by a 120° C. bake for 10 minutes to remove solvent residue. Devices were completed by thermally evaporating a 100-nm thick silver gate electrode through shadow masks under high vacuum (<6×10$^{-6}$ Torr).

Figure 13:
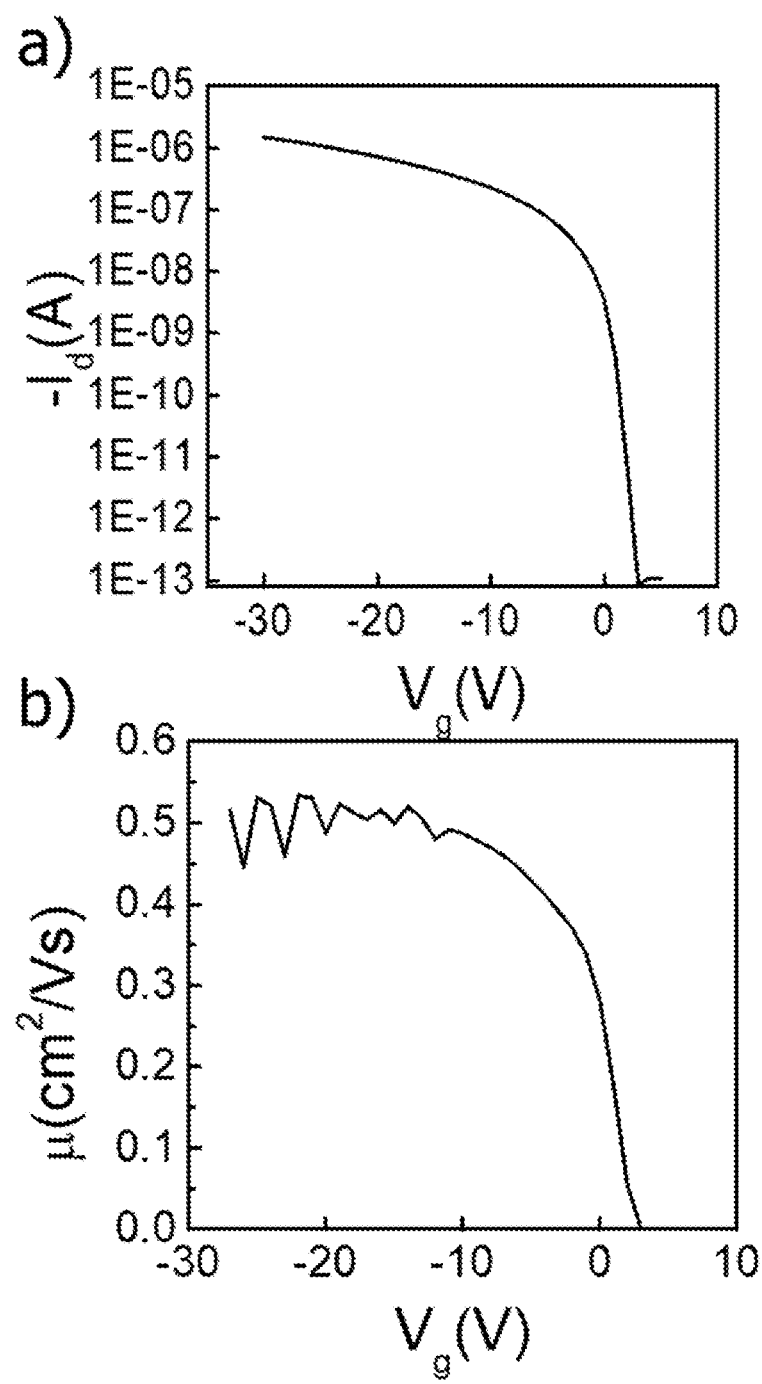
FIG. 13 shows representative transfer (a) and mobility evolution (b) plots for a polymer of the present teaching used as a dielectric layer for a p-type semiconductor.

Devices were measured in ambient atmosphere using a Keithley 4200 parameter analyzer. Typical transfer characteristics for the above-described devices are given in FIG. 13, with typical mobilities of ~0.45 cm$^2$/Vs.

Example 13: Bias Stress Measurements

Figure 14:
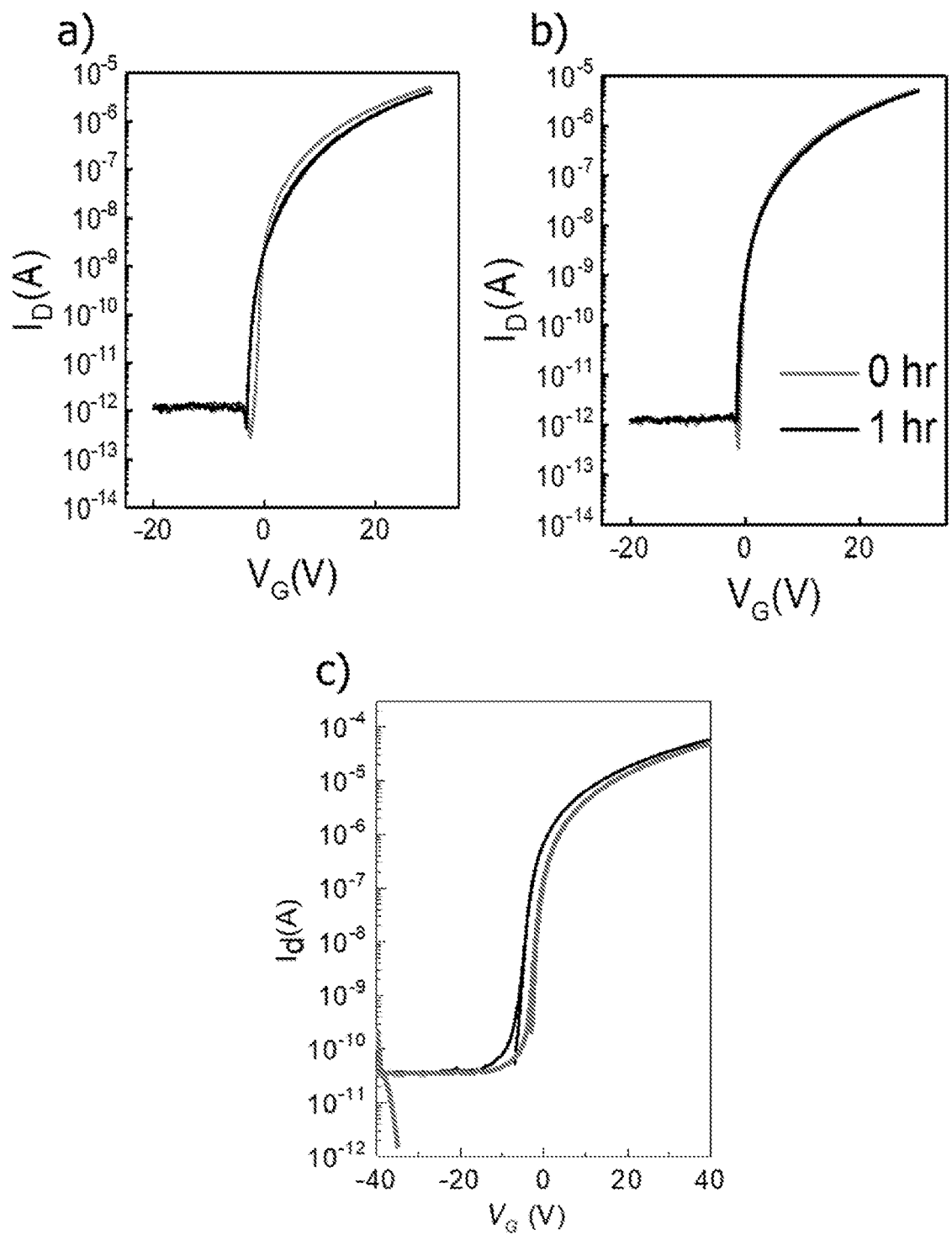
FIG. 14 shows representative transfer curves for PBTS experiments (gray curve before PTBT, black curve after 1 h PTBS) for a polymer acting as: a) protection layer, b) photoresist layer, and c) passivation layer.

The TFT sample was placed on a heated stage at 60 C and after the initial $I_{DS}$-$V_{GS}$ measurement, a constant gate bias stress ($V_{GS}$) of +30V (for PBTS) were applied for 60 mins while the drain voltage ($V_{DS}$) was maintained at 0V, immediately followed by another $I_{DS}$-$V_{GS}$ measurement. The difference between the turn on voltage of the two $I_{DS}$-$V_{GS}$ curves indicates the voltage shift under bias stress. FIG. 14 reports representative transfer curves for the bias stress experiment.

The present teachings encompass embodiments in other specific forms without departing from the spirit or essential characteristics thereof. The foregoing embodiments are therefore to be considered in all respects illustrative rather than limiting on the present teachings described herein. The scope of the present disclosure is thus indicated by the appended claims rather than by the foregoing description, and all changes that come within the meaning and range of equivalency of the claims are intended to be embraced therein.

Additional aspects of the disclosure are provided by the enumerated embodiments below, which can be combined in any number and in any way that is not technically or logically inconsistent.

Embodiment 1. A polymer having a repeating unit of Formula (I):

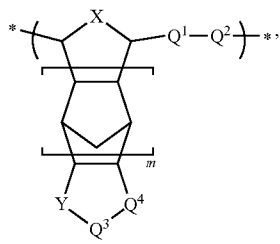

wherein in each repeating unit

X is independently selected from the group consisting of —CH$_2$—, —CHR—, —CR$_2$—, —C(O), —SiH$_2$—, —SiHR—, —SiR$_2$—, —NH—, —NR—, —O— and —S—;

Y is independently absent or selected from the group consisting of —CH$_2$—, —CHR—, —CR$_2$—, —C(O), —SiH$_2$—, —SiHR—, —SiR$_2$—, —NH—, —NR—, —O— and —S—;

R is independently selected from the group consisting of a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$alkyl group, a C$_{1-10}$haloalkyl group, and an optionally substituted aryl or heteroaryl group, wherein R$^3$ is a C$_{1-10}$alkyl group or a —Si(C$_{1-10}$alkyl)$_3$ group, and R$^4$ and R$^5$ independently are hydrogen or a C$_{1-10}$alkyl group; and m is independently 0, 1 or 2, Q$^1$-Q$^2$ and Q$^3$-Q$^4$ are each independently —C(H)=C(H)— or

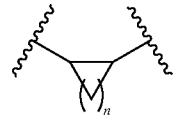

in which each n is independently selected from 1, 2, 3 and 4, provided that the polymer includes at least one repeating unit of Formula (I) wherein Q$^1$-Q$^2$ or Q$^3$-Q$^4$ is

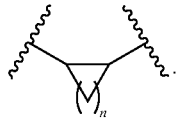

Embodiment 2. The polymer of embodiment 1, having the structure of Formula (Ig):

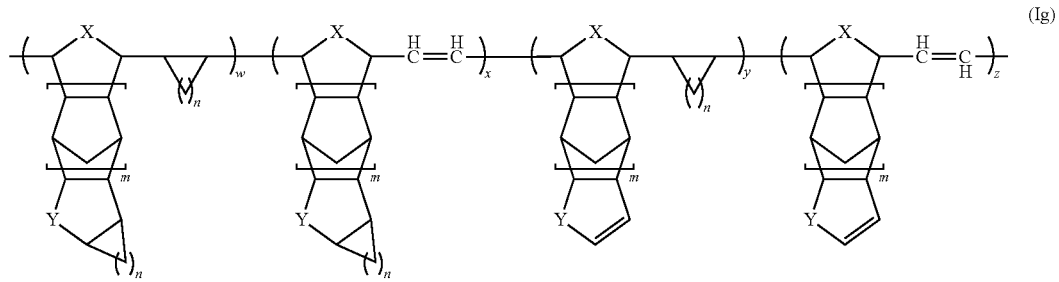

wherein each of w, x, y and z is in the range of 0-100% of the number of monomeric units of the polymer, and the sum of w, x, y and z is at least 80% of the number of monomeric units of the polymer.

Embodiment 3. The polymer of embodiment 2, wherein the sum of w, x, y and z is at least 90% of the number of monomeric units of the polymer, e.g., at least 95% or even at least 99%.

Embodiment 4. The polymer of any of embodiments 1-3, wherein n is the same in each of the repeating units.

Embodiment 5. The polymer of embodiment 4, wherein n is 1 in each of the repeating units.

Embodiment 6. The polymer of embodiment 4, wherein n is 2 in each of the repeating units.

Embodiment 7. The polymer of embodiment 4, wherein n is 3 or 4 in each of the repeating units.

Embodiment 8. The polymer of any of embodiments 1-3, wherein at least 50% of the values of n are the same, e.g., at least 70%, at least 90% or at least 95%.

Embodiment 9. The polymer of embodiment 8, wherein at least 50% of the values of n are 1, e.g., at least 70%, at least 90% or at least 95%.

Embodiment 10. The polymer of embodiment 8, wherein at least 50% of the values of n are 2, e.g., at least 70%, at least 90% or at least 95%.

Embodiment 11. The polymer of embodiment 8, wherein at least 50% of the values of n are 3 or 4, e.g., at least 70%, at least 90% or at least 95%.

Embodiment 12. The polymer of any of embodiments 1-11, wherein the ratio of 1,2-cycloalkanediyl moieties to the sum of 1,2-cycloalkanediyl and ethenediyl moieties is in the range of 5-95%, e.g., 5-90%, or 5-80%, or 5-70%, or 5-60%, or 5-55%, or 5-50%, or 10-95%, or 10-90%, or 10-80%, or 10-70%, or 10-60%, or 10-55%, or 10-50%, or 20-95%, or 20-90%, or 20-80%, or 20-70%, or 20-60%, or 20-55%, or 20-50%, or 30-95%, or 30-90%, or 30-80%, or 30-70%, or 30-60%, or 30-55%, or 30-50%, or 40-95%, or 40-90%, or 40-80%, or 40-70%, or 40-60%, or 40-55%, or 40-50%, or 45-95%, or 45-90%, or 45-80%, or 45-70%, or 45-60%, or 45-55%, or 45-50%, or 50%-95%, or 50-90%, or 50-80%, or 50-70%, or 50-60%, or 50-55%.

Embodiment 13. The polymer of any of embodiments 1-12, wherein each X is independently selected from the group consisting of —CH$_2$—, —CHR—, —CR$_2$—, —C(O), —SiH$_2$—, —SiHR—, —SiR$_2$—, —NH—, —NR—, —O— and —S—.

Embodiment 14. The polymer of any of embodiments 1-12, wherein each X is independently selected from the group consisting of —CH$_2$—, —CHR—, —CR$_2$—, —C(O), —NH—, —NR—, —O— and —S—.

Embodiment 15. The polymer of any of embodiments 1-12, wherein each X is independently selected from the group consisting of —CH$_2$—, —CHR—, —CR$_2$—, —SiH$_2$—, —SiHR—, —SiR$_2$—, —NH—, —NR—, —O— and —S—.

Embodiment 16. The polymer of any of embodiments 1-12, wherein each X is independently selected from the group consisting of —CH$_2$—, —SiH$_2$—, —SiHR—, —SiR$_2$—, —NH—, —NR—, —O— and —S—.

Embodiment 17. The polymer of any of embodiments 1-12, wherein each X is independently selected from the group consisting of —CH$_2$—, —CHR—, —SiH$_2$—, —SiHR—, —NH—, —NR—, —O— and —S—.

Embodiment 18. The polymer of any of embodiments 1-12, wherein each X is independently selected from the group consisting of —CH$_2$—, —SiH$_2$—, —NH—, —O— and —S—.

Embodiment 19. The polymer of any of embodiments 1-12, wherein each X is independently selected from the group consisting of —CH$_2$—, —NH—, —NR—, —O— and —S—.

Embodiment 20. The polymer of any of embodiments 1-12, wherein each X is independently selected from the group consisting of —CH$_2$—, —NH— and —O—.

Embodiment 21. The polymer of any of embodiments 1-12, wherein each X is independently selected from the group consisting of —CH$_2$— and —O—.

Embodiment 22. The polymer of any of embodiments 1-21, wherein at least 70% of the X groups are the same, e.g., at least 80%, at least 90%, or even at least 95%.

Embodiment 23. The polymer of any of embodiments 1-12, wherein each X is —CH$_2$—.

Embodiment 24. The polymer of any of embodiments 1-23, wherein each Y is independently selected from the group consisting of —CH$_2$—, —CHR—, —CR$_2$—, —C(O), —SiH$_2$—, —SiHR—, —SiR$_2$—, —NH—, —NR—, —O— and —S—;

Embodiment 25. The polymer of any of embodiments 1-23, wherein each Y is independently selected from the group consisting of —CH$_2$—, —CHR—, —CR$_2$—, —C(O), —SiH$_2$—, —SiHR—, —SiR$_2$—, —NH—, —NR— and —O—.

Embodiment 26. The polymer of any of embodiments 1-23, wherein each Y is independently selected from the group consisting of —CH$_2$—, —CHR—, —CR$_2$—, —C(O), —NH—, —NR—, —O— and —S—.

Embodiment 27. The polymer of any of embodiments 1-23, wherein each Y is independently selected from the group consisting of —CH$_2$—, —CHR—, —CR$_2$—, —SiH$_2$—, —SiHR—, —SiR$_2$—, —NH—, —NR—, —O— and —S—.

Embodiment 28. The polymer of any of embodiments 1-23, wherein each Y is independently selected from the group consisting of —CH$_2$—, —SiH$_2$—, —SiHR—, —SiR$_2$—, —NH—, —NR—, —O— and —S—.

Embodiment 29. The polymer of any of embodiments 1-23, wherein each Y is independently selected from the group consisting of —CH$_2$—, —CHR—, —SiH$_2$—, —SiHR—, —NH—, —NR—, —O— and —S—.

Embodiment 30. The polymer of any of embodiments 1-23, wherein each Y is independently selected from the group consisting of —CH$_2$—, —SiH$_2$—, —NH—, —O— and —S—.

Embodiment 31. The polymer of any of embodiments 1-23, wherein each Y is independently selected from the group consisting of —CH$_2$—, —NH—, —NR—, —O— and —S—.

Embodiment 32. The polymer of any of embodiments 1-23, wherein each Y is independently selected from the group consisting of —CH$_2$—, —NH— and —O—.

Embodiment 33. The polymer of any of embodiments 1-23, wherein each Y is independently selected from the group consisting of —CH$_2$— and —O—.

Embodiment 34. The polymer of any of embodiments 1-33, wherein at least 70% of the Y groups are the same, e.g., at least 80%, at least 90%, or even at least 95%.

Embodiment 35. The polymer of any of embodiments 1-33, wherein each Y is —CH$_2$—.

Embodiment 36. The polymer of any of embodiments 1-35, wherein each R is independently selected from the group consisting of a halogen, —OR³, —C(O)OR³, —OC(O)R³, —NR⁴R⁵, —C(O)NR⁴R⁵, —OC(O)NR⁴R⁵, a C₁₋₁₀alkyl group, a C₁₋₁₀haloalkyl group, and an optionally substituted aryl or heteroaryl group, wherein R³ is a C₁₋₁₀alkyl group, and R⁴ and R⁵ independently are hydrogen or a C₁₋₁₀alkyl group.

Embodiment 37. The polymer of any of embodiments 1-35, wherein each R is independently selected from the group consisting of a halogen, —OR³, —C(O)OR³, —OC(O)R³, —NR⁴R⁵, —C(O)NR⁴R⁵, —OC(O)NR⁴R⁵, a C₁₋₁₀haloalkyl group, and an optionally substituted aryl or heteroaryl group, wherein R³ is a C₁₋₁₀alkyl group, and R⁴ and R⁵ independently are hydrogen or a C₁₋₁₀alkyl group.

Embodiment 38. The polymer of any of embodiments 1-35, wherein each R is independently selected from the group consisting of a halogen, —OR³, —C(O)OR³, —OC(O)R³, —NR⁴R⁵, —C(O)NR⁴R⁵, —OC(O)NR⁴R⁵, a C₁₋₁₀haloalkyl group, and an optionally substituted aryl or heteroaryl group, wherein R³ is a C₁₋₁₀alkyl group, and R⁴ and R⁵ are hydrogen.

Embodiment 39. The polymer of any of embodiments 1-35, wherein each R is independently selected from the group consisting of a halogen, —OR³, —C(O)OR³, —OC(O)R³, —NR⁴R⁵, —C(O)NR⁴R⁵, —OC(O)NR⁴R⁵, a C₁₋₁₀alkyl group, a C₁₋₁₀haloalkyl group, and an optionally substituted aryl or heteroaryl group, wherein R³ is a C₁₋₁₀alkyl group, and R⁴ and R⁵ are hydrogen.

Embodiment 40. The polymer of any of embodiments 1-35, wherein each R is independently selected from the group consisting of a halogen, —OR³, a C₁₋₁₀alkyl group, a C₁₋₁₀haloalkyl group, and an optionally substituted aryl or heteroaryl group, wherein R³ is a C₁₋₁₀alkyl group.

Embodiment 41. The polymer of any of embodiments 1-35, wherein each R is independently selected from the group consisting of a halogen, —OR³, a C₁₋₁₀alkyl group and a C₁₋₁₀haloalkyl group, wherein R³ is a C₁₋₁₀alkyl group.

Embodiment 42. The polymer of any of embodiments 1-35, wherein each R is independently selected from the group consisting of a halogen, a C₁₋₁₀alkyl group and a C₁₋₁₀haloalkyl group.

Embodiment 43. The polymer of any of embodiments 1-35, wherein each R is independently a halogen.

Embodiment 44. The polymer of any of embodiments 1-35, wherein each R is independently a C₁₋₁₀alkyl group.

Embodiment 45. The polymer of any of embodiments 1-35, wherein each R is independently a C₁₋₁₀haloalkyl group.

Embodiment 46. The polymer of any of embodiments 1-45, wherein at least 70% of the R groups are the same, e.g., at least 80%, at least 90%, or even at least 95%.

Embodiment 47. The polymer of any of embodiments 1-46, wherein at least 50% (e.g., at least 70%, at least 80%, or at least 90%) of the values of m are 0 or 1.

Embodiment 48. The polymer of any of embodiments 1-46, wherein at least 50% (e.g., at least 70%, at least 80%, or at least 90%) of the values of m are 0.

Embodiment 49. The polymer of any of embodiments 1-46, wherein no more than 50% (e.g., no more than 30%, no more than 20%, or no more than 10%) of the values of m are 2.

Embodiment 50. The polymer of any of embodiments 1-49, wherein each X is CH₂ and each Y is CH₂.

Embodiment 51. The polymer of embodiment 2, having the structure of Formula (Ih):

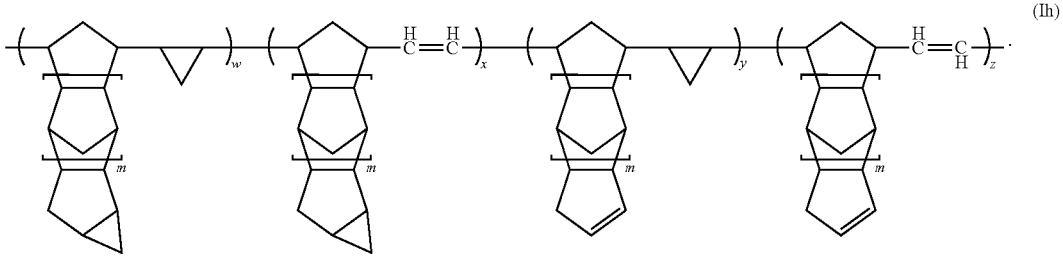

Embodiment 52. The polymer of any of embodiments 1-51, wherein at least 10% of the Q¹-Q² and Q³-Q⁴ groups are 1,2-cycloalkanediyl, e.g., at least 20%, at least 30% or at least 40%.

Embodiment 53. The polymer of any of embodiments 1-52, wherein the polymer is end-functionalized with a photo-crosslinkable moiety selected from the group consisting of an acrylate group and a cinnamate group.

Embodiment 54. The polymer of any of embodiments 1-53, having a dielectric constant of at least about 2.3.

Embodiment 55. The polymer of any of embodiments 1-53, having a dielectric constant of between about 2.5 and about 10.

Embodiment 56. The polymer of any of embodiments 1-53, having a dielectric constant of about 3 and about 5.

Embodiment 57. A method for making the polymer of any of embodiments 1-56, the method comprising cycloalkanating a plurality of double bonds of a precursor polymer, wherein the precursor polymer has a repeating unit having the structure of Formula (II):

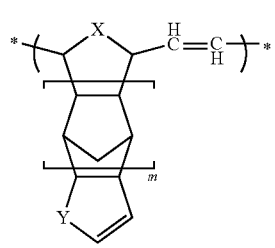

wherein
X is selected from the group consisting of —CH₂—, —CHR—, —CR₂—, —C(O), —SiH₂—, —SiHR—, —SiR₂—, —NH—, —NR—, —O— and —S—;

Y is absent or selected from the group consisting of —CH$_2$—, —CHR—, —CR$_2$—, —C(O), —SiH$_2$—, —SiHR—, —SiR$_2$—, —NH—, —NR—, —O— and —S—;

R is selected from the group consisting of a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$alkyl group, a C$_{1-10}$haloalkyl group, and an optionally substituted aryl or heteroaryl group, wherein R$^3$ is a C$_{1-10}$alkyl group or a —Si(C$_{1-10}$alkyl)$_3$ group, and R$^4$ and R$^5$ independently are hydrogen or a C$_{1-10}$alkyl group; and m is 0, 1 or 2.

Embodiment 58. The method of embodiment 57, wherein the cycloalkanation is a cyclopropanation.

Embodiment 59. The method of embodiment 58, wherein the cyclopropanation is performed by reacting double bonds of the polymer with diidomethane, e.g., in the presence of a metal catalyst.

Embodiment 60. A polymer made by a process according to any of embodiments 57-59.

Embodiment 61. An electronic device comprising a polymer according to any of embodiments 1-56 or 60.

Embodiment 62. The electronic device of embodiment 62, comprising a transistor having a semiconductor layer, a dielectric layer, source electrode, drain electrode, and gate electrode, wherein at least one of the semiconductor layer, dielectric layer, source electrode, drain electrode or gate electrode comprises the polymer.

Embodiment 63. The electronic device of embodiment 63, wherein the transistor is a thin film transistor (TFT), an organic field-effect transistor (OFET) or metal oxide field-effect transistor (MOFET).

Embodiment 64. The electronic device of embodiment 62 or 63, wherein the dielectric layer comprises the polymer.

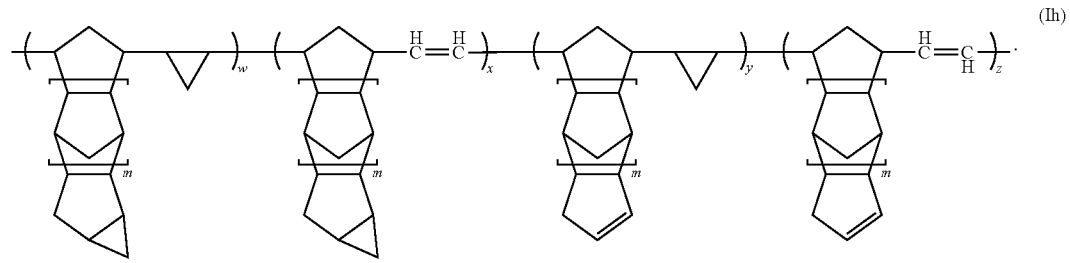

What is claimed is:

1. A polymer having a repeating unit of Formula (I):

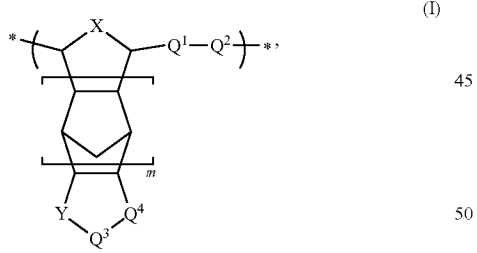

(I)

wherein in each repeating unit

X is independently selected from the group consisting of —CH$_2$—, —CHR—, —CR$_2$—, —C(O), —SiH$_2$—, —SiHR—, —SiR$_2$—, —NH—, —NR—, —O— and —S—;

Y is independently absent or selected from the group consisting of —CH$_2$—, —CHR—, —CR$_2$—, —C(O), —SiH$_2$—, —SiHR—, —SiR$_2$—, —NH—, —NR—, —O— and —S—;

R is independently selected from the group consisting of a halogen, —OR$^3$, —C(O)OR$^3$, —OC(O)R$^3$, —NR$^4$R$^5$, —C(O)NR$^4$R$^5$, —OC(O)NR$^4$R$^5$, a C$_{1-10}$alkyl group, a C$_{1-10}$haloalkyl group, and an optionally substituted aryl or heteroaryl group, wherein R$^3$ is a C$_{1-10}$alkyl group or a —Si(C$_{1-10}$alkyl)$_3$ group, and R$^4$ and R$^5$ independently are hydrogen or a C$_{1-10}$alkyl group; and m is independently 0, 1 or 2, Q$^1$-Q$^2$ and Q$^3$-Q$^4$ are each independently —C(H)=C(H)— or

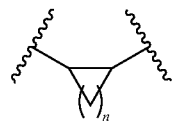

in which each n is independently 1 or 2, provided that the polymer includes at least one repeating unit of Formula (I) wherein Q$^{1-}$-Q$^2$ or Q$^3$-Q$^4$ is

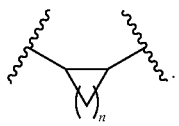

.

2. The polymer of claim 1, having the structure of Formula (Ig):

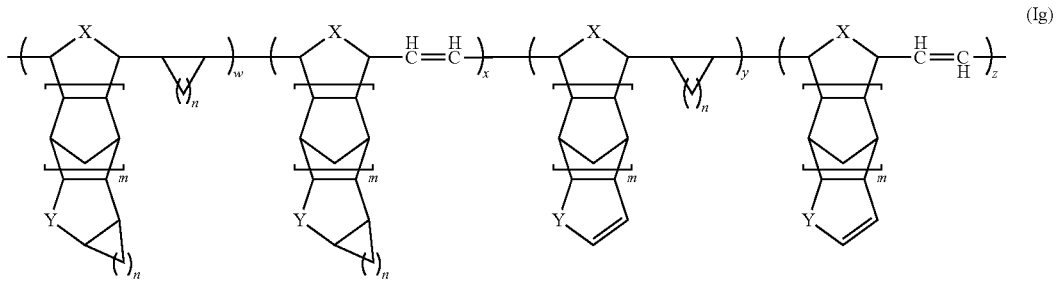

(Ig)

wherein each of w, x, y and z is in the range of 0-100% of the number of monomeric units of the polymer, and the sum of w, x, y and z is at least 80% of the number of monomeric units of the polymer.

3. The polymer of claim 2, wherein the sum of w, x, y and z is at least 90% of the number of monomeric units of the polymer.

4. The polymer of claim 1, wherein n is the same in each of the repeating units.

5. The polymer of claim 4, wherein n is 1 in each of the

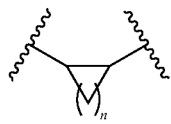

groups.

6. The polymer of claim 1 wherein at least 70% of the values of n are the same.

7. The polymer of claim 1, wherein the ratio of 1,2-cycloalkanediyl moieties to the sum of 1,2-cycloalkanediyl and ethenediyl moieties is in the molar range of 5-95%.

8. The polymer of claim 1, wherein each X is independently selected from the group consisting of —$CH_2$—, —CHR—, —$CR_2$—, —C(O)—, —NH—, —NR—, —O— and —S—.

9. The polymer of claim 1, wherein at least 70% of the X groups are the same, and at least 70% of the Y groups are the same.

10. The polymer of claim 1, wherein each X is —$CH_2$— and each Y is —$CH_2$—.

11. The polymer of claim 1, wherein each Y is independently selected from the group consisting of —$CH_2$—, —CHR—, —$CR_2$—, —C(O)—, —$SiH_2$—, —SiHR—, —$SiR_2$—, —NH—, —NR—, —O— and —S—.

12. The polymer of claim 1, wherein each R is independently selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$alkyl group, a $C_{1-10}$haloalkyl group, and an optionally substituted aryl or heteroaryl group, wherein $R^3$ is a $C_{1-10}$alkyl group, and $R^4$ and $R^5$ independently are hydrogen or a $C_{1-10}$alkyl group.

13. The polymer of claim 1, wherein at least 70% of the R groups are the same.

14. The polymer of claim 1, wherein at least 50% of the values of m are 0 or 1.

15. The polymer of claim 2, having the structure of Formula (Ih):

16. The polymer of claim 1, wherein the polymer is end-functionalized with a photocrosslinkable moiety selected from the group consisting of an acrylate group and a cinnamate group.

17. The polymer of claim 1, having a dielectric constant of at least about 2.3.

18. A method for making the polymer of claim 1, the method comprising cycloalkanating a plurality of double bonds of a precursor polymer, wherein the precursor polymer has a repeating unit having the structure of Formula (II):

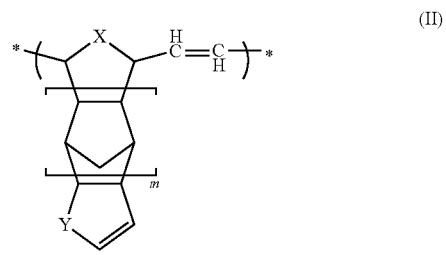

wherein

X is selected from the group consisting of —$CH_2$—, —CHR—, —$CR_2$—, —C(O), —$SiH_2$—, —SiHR—, —$SiR_2$—, —NH—, —NR—, —O— and —S—;

Y is absent or selected from the group consisting of —$CH_2$—, —CHR—, —$CR_2$—, —C(O), —$SiH_2$—, —SiHR—, —$SiR_2$—, —NH—, —NR—, —O— and —S—;

R is selected from the group consisting of a halogen, —$OR^3$, —$C(O)OR^3$, —$OC(O)R^3$, —$NR^4R^5$, —$C(O)NR^4R^5$, —$OC(O)NR^4R^5$, a $C_{1-10}$alkyl group, a $C_{1-10}$haloalkyl group, and an optionally substituted aryl or heteroaryl group, wherein $R^3$ is a $C_{1-10}$alkyl group or a —$Si(C_{1-10}alkyl)_3$ group, and $R^4$ and $R^5$ independently are hydrogen or a $C_{1-10}$alkyl group; and m is 0, 1 or 2.

19. An electronic device comprising a polymer according to claim 1.

20. The electronic device of claim 19, comprising a transistor having a semiconductor layer, a dielectric layer, source electrode, drain electrode, and gate electrode, wherein at least one of the semiconductor layer, dielectric layer, source electrode, drain electrode or gate electrode comprises the polymer.

* * * * *